(12) United States Patent
Osame et al.

(10) Patent No.: US 8,054,111 B2
(45) Date of Patent: Nov. 8, 2011

(54) SEMICONDUCTOR DEVICE AND ELECTRONIC APPLIANCE USING THE SAME

(75) Inventors: Mitsuaki Osame, Atsugi (JP); Tomoyuki Iwabuchi, Atsugi (JP); Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 629 days.

(21) Appl. No.: 10/574,290

(22) PCT Filed: Dec. 7, 2005

(86) PCT No.: PCT/JP2005/022901
§ 371 (c)(1),
(2), (4) Date: Mar. 31, 2006

(87) PCT Pub. No.: WO2006/064822
PCT Pub. Date: Jun. 22, 2006

(65) Prior Publication Data
US 2008/0252363 A1    Oct. 16, 2008

(30) Foreign Application Priority Data
Dec. 13, 2004 (JP) .................. 2004-360636

(51) Int. Cl.
*H03B 1/00* (2006.01)
(52) U.S. Cl. ......... 327/112; 327/108; 327/170; 327/333
(58) Field of Classification Search .................. 327/108, 327/112, 170, 333, 391, 261, 264; 326/81, 326/83; 345/92, 210
See application file for complete search history.

(56) References Cited

U.S. PATENT DOCUMENTS

| | | | |
|---|---|---|---|
| 4,578,600 A * | 3/1986 | Magee | 326/83 |
| 4,833,350 A | 5/1989 | Frisch | |
| 5,039,893 A * | 8/1991 | Tomisawa | 327/276 |
| 5,198,699 A * | 3/1993 | Hashimoto et al. | 327/108 |
| 5,276,365 A | 1/1994 | Maekawa | |
| 5,444,401 A | 8/1995 | Crafts | |
| 5,568,084 A | 10/1996 | McClure et al. | |
| 5,581,209 A | 12/1996 | McClure | |

(Continued)

FOREIGN PATENT DOCUMENTS
EP    0339679 A    11/1989
(Continued)

OTHER PUBLICATIONS
International Search Report (Application No. PCT/JP2005/022901; PCT8428) dated Feb. 21, 2006.
(Continued)

*Primary Examiner* — Long Nguyen
(74) *Attorney, Agent, or Firm* — Eric J. Robinson; Robinson Intellectual Property Law Office, P.C.

(57) ABSTRACT

A semiconductor device with less power consumption and an electronic appliance using the same. The semiconductor device of the invention is supplied with a first potential from a high potential power source and a second potential from a low potential power source. Upon input of a first signal to an input node, an output node outputs a second signal. With the semiconductor device of the invention, a potential difference of the second signal can be controlled to be smaller than a potential difference between the first potential and the second potential, thereby power consumption required for charging/discharging wires can be reduced.

7 Claims, 23 Drawing Sheets

U.S. PATENT DOCUMENTS

| | | |
|---|---|---|
| 5,598,106 A | 1/1997 | Kawasaki et al. |
| 5,640,122 A | 6/1997 | McClure |
| 5,654,663 A | 8/1997 | McClure et al. |
| 5,793,247 A | 8/1998 | McClure |
| 5,939,937 A | 8/1999 | Terletzki |
| 6,646,486 B2 * | 11/2003 | Uchiki et al. .............. 327/202 |
| 6,924,673 B2 | 8/2005 | Tanishima |
| 7,268,592 B2 | 9/2007 | Tanishima |

FOREIGN PATENT DOCUMENTS

| | | |
|---|---|---|
| EP | 0481530 A | 4/1992 |
| EP | 0486071 A | 5/1992 |
| EP | 0717334 A | 6/1996 |
| EP | 0718744 A | 6/1996 |
| EP | 0731403 A | 9/1996 |
| EP | 0747800 A | 12/1996 |
| EP | 0 905 902 | 3/1999 |
| EP | 1369997 A | 12/2003 |
| EP | 2267897 A | 12/2010 |
| JP | 58-064828 | 4/1983 |
| JP | 58-162130 | 9/1983 |
| JP | 62-125713 | 6/1987 |
| JP | 62-190923 A | 8/1987 |
| JP | 02-119427 A | 5/1990 |
| JP | 02-290327 A | 11/1990 |
| JP | 04-236516 | 8/1992 |
| JP | 07-007413 A | 1/1995 |
| JP | 07-022939 A | 1/1995 |
| JP | 08-107345 | 4/1996 |
| JP | 08-107345 A * | 4/1996 |
| JP | 09-036673 A | 2/1997 |
| JP | 11-163715 | 6/1999 |
| JP | 2000-040366 | 2/2000 |
| JP | 2001-024501 A | 1/2001 |
| JP | 3407975 | 5/2003 |
| JP | 2004-007212 A | 1/2004 |
| JP | 2004-126513 | 4/2004 |
| JP | 2004-159197 | 6/2004 |

OTHER PUBLICATIONS

Written Opinion (Application No. PCT/JP2005/022901; PCT8428) dated Feb. 21, 2006.

* cited by examiner

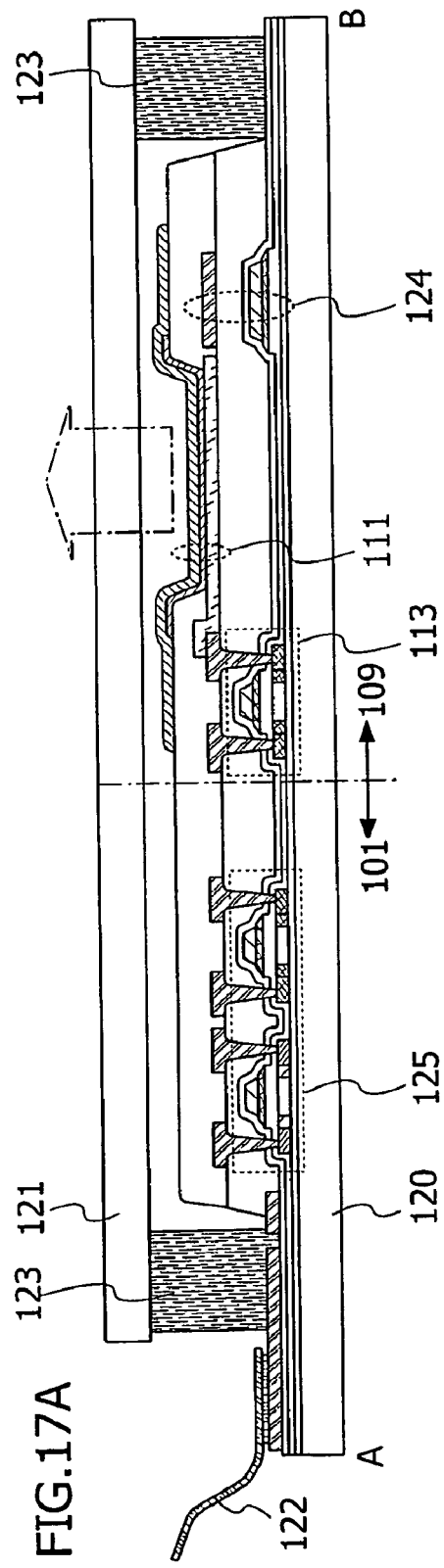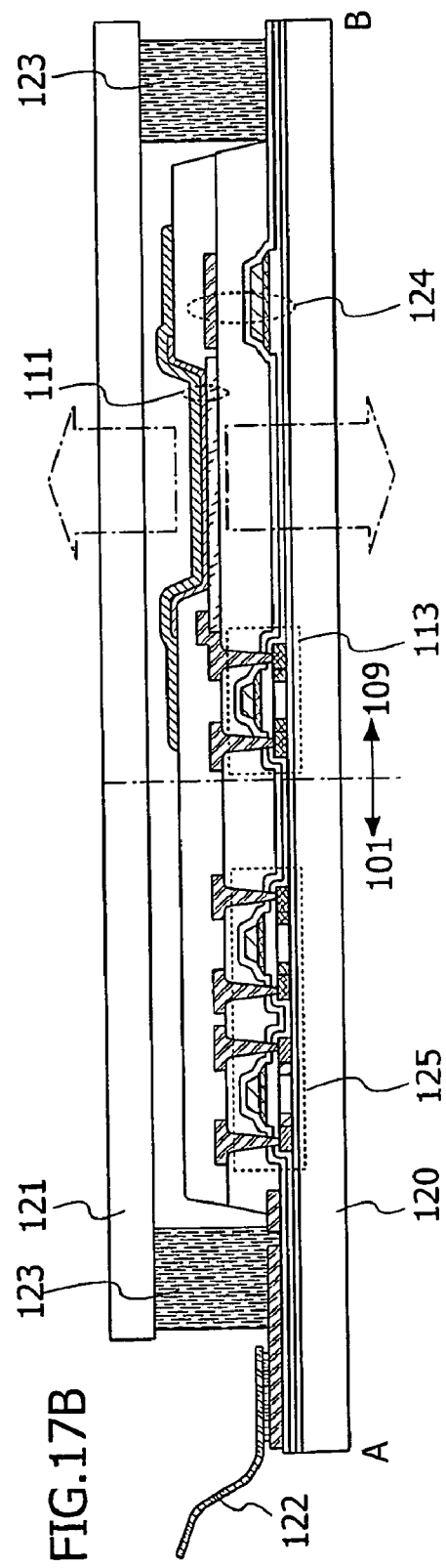

PRIOR ART

SEMICONDUCTOR DEVICE AND ELECTRONIC APPLIANCE USING THE SAME

TECHNICAL FIELD

The present invention relates to a semiconductor device which has input and output nodes, where a signal is outputted from the output node upon input of a signal to the input node. In addition, the invention relates to a semiconductor device including multiple transistors.

BACKGROUND ART

In recent years, semiconductor devices have been used in various electronic appliances, and development of the semiconductor devices are actively advanced. As one of the semiconductor devices, there is a semiconductor device having a source driver 101, a gate driver 106 and a pixel 110 (see FIG. 20A; and see Patent Document 1).

A signal output circuit 10 included in the source driver 101 is supplied with potentials from a high potential power source (VDD1) and a low potential power source (VSS1). The signal output circuit 10 included in the source driver 101 has input and output nodes, and the output node outputs a signal having the same potential as VDD1 or VSS1 upon input of a signal to the input node. The signal outputted from the signal output circuit 10 is inputted to a p-channel transistor 113 through a source line 115 and an n-channel transistor 112, thereby the p-channel transistor 113 is turned on or off.

A signal output circuit 10 included in the gate driver 106 is supplied with potentials from a high potential power source (VDD2) and a low potential power source (VSS2). The signal output circuit 10 included in the gate driver 106 has input and output nodes, and the output node outputs a signal having the same potential as VDD2 or VSS2 upon input of a signal to the input node. The signal outputted from the signal output circuit 10 is inputted to the n-channel transistor 112 through a gate line 116, thereby the n-channel transistor 112 is turned on or off.

A potential of the source line 115 connected to the output node of the signal output circuit 10 included in the source driver 101 alternately changes between potentials of the VDD1 and VSS1 (see FIG. 20B). Similarly, a potential of the gate line 116 connected to the output node of the signal output circuit 10 included in the gate driver 106 alternately changes between potentials of the VDD2 or VSS2.

[Patent Document 1] Japanese Patent Laid-Open No. 2004-126513 (FIGS. 12 and 13)

DISCLOSURE OF INVENTION

In general, a high potential power source and a low potential power source have a large potential difference. For example, if VDD1 is 10 V and VSS1 is 0V, there is a potential difference of 10 V between them. Meanwhile, if VDD2 is 12 V and VSS2 is −2V, there is a potential difference of 14 V between them. When there is a large potential difference between VDD1 and VSS1 and between VDD2 and VSS2, power consumption required for charging/discharging source lines and gate lines is increased.

In addition, in the case of using a time gray scale method for expressing gray scales, one frame is divided into multiple sub-frames, and source lines and gate lines are charged/discharged in each sub-frame period. That is, when the time gray scale method is used, the number of charging/discharging operations of source lines and gate lines is increased, thereby power consumption is further increased.

Therefore, it is a primary object of the invention to provide a semiconductor device where power consumption required for charging/discharging source lines and gate lines can be reduced.

It is another object of the invention to provide a semiconductor device where power consumption can be reduced by controlling a potential difference between two signals outputted from an output node to be smaller than a potential difference between a high potential power source and a low potential power source.

A semiconductor device of the invention is supplied with potentials from a high potential power source and a low potential power source. In addition, the semiconductor device of the invention has input and output nodes. Upon input of a signal to the input node, the output node outputs a signal having a first potential (also referred to as a first signal potential) and a signal having a second potential (also referred to as a second signal potential). According to the invention, a potential difference between the signal having a first potential and the signal having a second potential is controlled to be smaller than a potential difference between the high potential power source and the low potential power source, thereby power consumption is reduced.

A semiconductor device of the invention includes a first transistor, a second transistor and a third transistor connected in series, and a potential generating circuit. One of a source electrode and a drain electrode of the first transistor is connected to a high potential power source (also referred to as a first power source applying a first potential); a gate electrode of the third transistor is connected to the potential generating circuit; one of a source electrode and a drain electrode of the third transistor is connected to one of a source electrode and a drain electrode of the second transistor; and the other of the source electrode and the drain electrode of the third transistor is connected to a low potential power source (also referred to as a second power source applying a second potential). Upon input of a signal (first signal) to gate electrodes of the first transistor and the second transistor, a signal (second signal) is outputted from the other of the source electrode and the drain electrode of the first transistor and the other of the source electrode and the drain electrode of the second transistor.

In the aforementioned configuration, the first transistor is a p-channel transistor, the second transistor is an n-channel transistor, and the third transistor is a p-channel transistor.

A semiconductor device of the invention includes a first transistor, a second transistor and a third transistor connected in series, and a potential generating circuit. One of a source electrode and a drain electrode of the second transistor is connected to a low potential power source (also referred to as a second power source applying a second potential); a gate electrode of the third transistor is connected to the potential generating circuit; one of a source electrode and a drain electrode of the third transistor is connected to one of a source electrode and a drain electrode of the first transistor; and the other of the source electrode and the drain electrode of the third transistor is connected to a high potential power source (also referred to as a first power source applying a first potential). Upon input of a signal (first signal) to gate electrodes of the first transistor and the second transistor, a signal (second signal) is outputted from the other of the source electrode and the drain electrode of the first transistor and the other of the source electrode and the drain electrode of the second transistor.

In the aforementioned configuration, the first transistor is a p-channel transistor, the second transistor is an n-channel transistor, and the third transistor is an n-channel transistor.

A semiconductor device of the invention includes a first transistor, a second transistor, a third transistor and a fourth transistor connected in series, and potential generating circuits. Gate electrodes of the third transistor and the fourth transistor are connected to the potential generating circuits; one of a source electrode and a drain electrode of the third transistor is connected to one of a source electrode and a drain electrode of the second transistor; and the other of the source electrode and the drain electrode of the third transistor is connected to a low potential power source (also referred to as a second power source applying a second potential). One of a source electrode and a drain electrode of the fourth transistor is connected to one of a source electrode and a drain electrode of the first transistor; and the other of the source electrode and the drain electrode of the fourth transistor is connected to a high potential power source (also referred to as a first power source applying a first potential). Upon input of a signal (first signal) to gate electrodes of the first transistor and the second transistor, a signal (second signal) is outputted from the other of the source electrode and the drain electrode of the first transistor and the other of the source electrode and the drain electrode of the second transistor.

In the aforementioned configuration, the first transistor is a p-channel transistor, the second transistor is an n-channel transistor, the third transistor is a p-channel transistor, and the fourth transistor is an n-channel transistor.

A semiconductor device of the invention includes a first transistor and a second transistor connected in series, a third transistor and a fourth transistor connected in series, and a potential generating circuit. One of a source electrode and a drain electrode of the first transistor is connected to a high potential power source (also referred to as a first power source applying a first potential); one of a source electrode and a drain electrode of the second transistor is connected to a low potential power source (also referred to as a second power source applying a second potential); a gate electrode of the second transistor is connected to one of a source electrode and a drain electrode of the third transistor and to one of a source electrode and a drain electrode of the fourth transistor. The other of the source electrode and the drain electrode of the third transistor is connected to the high potential power source; and the other of the source electrode and the drain electrode of the fourth transistor is connected to the potential generating circuit. Upon input of a signal (first signal) to gate electrodes of the first transistor, the third transistor and the fourth transistor, a signal (second signal) is outputted from the other of the source electrode and the drain electrode of the first transistor and the other of the source electrode and the drain electrode of the second transistor.

In the aforementioned configuration, the first transistor is a p-channel transistor, the second transistor is a p-channel transistor, the third transistor is a p-channel transistor, and the fourth transistor is an n-channel transistor.

A semiconductor device of the invention includes a first transistor and a second transistor connected in series, a third transistor and a fourth transistor connected in series, and a potential generating circuit. One of a source electrode and a drain electrode of the first transistor is connected to a high potential power source (also referred to as a first power source applying a first potential); one of a source electrode and a drain electrode of the second transistor is connected to a low potential power source (also referred to as a second power source applying a second potential); a gate electrode of the first transistor is connected to one of a source electrode and a drain electrode of the third transistor and to one of a source electrode and a drain electrode of the fourth transistor. The other of the source electrode and the drain electrode of the third transistor is connected to the low potential power source; and the other of the source electrode and the drain electrode of the fourth transistor is connected to the potential generating circuit. Upon input of a signal (first signal) to gate electrodes of the first transistor, the third transistor and the fourth transistor, a signal (second signal) is outputted from the other of the source electrode and the drain electrode of the first transistor and the other of the source electrode and the drain electrode of the second transistor.

In the aforementioned configuration, the first transistor is an n-channel transistor, the second transistor is an n-channel transistor, the third transistor is an n-channel transistor, and the fourth transistor is a p-channel transistor.

A semiconductor device of the invention includes a first transistor and a second transistor connected in series, a third transistor and a fourth transistor connected in series, a fifth transistor and a sixth transistor connected in series, and potential generating circuits. One of a source electrode and a drain electrode of the first transistor is connected to a high potential power source (also referred to as a first power source applying a first potential); and one of a source electrode and a drain electrode of the second transistor is connected to a low potential power source (also referred to as a second power source applying a second potential). A gate electrode of the second transistor is connected to one of a source electrode and a drain electrode of the third transistor and to one of a source electrode and a drain electrode of the fourth transistor; the other of the source electrode and the drain electrode of the third transistor is connected to the high potential power source; and the other of the source electrode and the drain electrode of the fourth transistor is connected to the potential generating circuits. A gate electrode of the first transistor is connected to one of a source electrode and a drain electrode of the fifth transistor and to one of a source electrode and a drain electrode of the sixth transistor; the other of the source electrode and the drain electrode of the fifth transistor is connected to the low potential power source; and the other of the source electrode and the drain electrode of the sixth transistor is connected to the potential generating circuits. Upon input of a signal (first signal) to gate electrodes of the third to sixth transistors, a signal (second signal) is outputted from the other of the source electrode and the drain electrode of the first transistor and the other of the source electrode and the drain electrode of the second transistor.

In the aforementioned configuration, the first transistor is an n-channel transistor, the second transistor is a p-channel transistor, the third transistor is a p-channel transistor, the fourth transistor is an n-channel transistor, the fifth transistor is an n-channel transistor, and the sixth transistor is a p-channel transistor.

A semiconductor device of the invention includes a first transistor and a second transistor connected in series, and a subtraction circuit (also referred to as a circuit) including one or more subtraction transistors (also referred to as third transistors). One of a source electrode and a drain electrode of the first transistor is connected to a high potential power source (also referred to as a first power source applying a first potential); the subtraction circuit is provided between one of a source electrode and a drain electrode of the second transistor and a low potential power source (also referred to as a second power source applying a second potential); and a gate electrode of the subtraction transistor is connected to a drain electrode thereof. Upon input of a signal (first signal) to gate electrodes of the first and second transistors, a signal (second signal) is outputted from the other of the source electrode and the drain electrode of the first transistor and the other of the source electrode and the drain electrode of the second transistor.

In the aforementioned configuration, the first transistor is a p-channel transistor, the second transistor is an n-channel transistor, and the subtraction transistor is an n-channel transistor.

In addition, in the aforementioned configuration, the multiple subtraction transistors included in the subtraction circuit are connected in series. One terminal of the subtraction circuit is connected to the one of the source electrode and the drain electrode of the second transistor, and the other terminal of the subtraction circuit is kept at a potential of the low potential power source.

A semiconductor device of the invention includes a first transistor and a second transistor connected in series, and a subtraction circuit (also referred to as a circuit) including one or more subtraction transistors (also referred to as third transistors). One of a source electrode and a drain electrode of the second transistor is connected to a low potential power source (also referred to as a second power source applying a second potential); the subtraction circuit is provided between one of a source electrode and a drain electrode of the first transistor and a high potential power source (also referred to as a first power source applying a first potential); and a gate electrode of the subtraction transistor is connected to a drain electrode thereof. Upon input of a signal (first signal) to gate electrodes of the first transistor and the second transistor, a signal (second signal) is outputted from the other of the source electrode and the drain electrode of the first transistor and the other of the source electrode and the drain electrode of the second transistor.

In the aforementioned configuration, the first transistor is a p-channel transistor, the second transistor is an n-channel transistor, and the subtraction transistor is a p-channel transistor.

In addition, in the aforementioned configuration, one terminal of the subtraction circuit is connected to the one of the source electrode and the drain electrode of the first transistor, and the other terminal of the subtraction circuit is kept at a potential of the high potential power source.

A semiconductor device of the invention includes a first transistor and a second transistor connected in series, a first subtraction circuit (also referred to as a first circuit) including one or more first subtraction transistors (also referred to as third transistors), and a second subtraction circuit (also referred to as a second circuit) including one or more second subtraction transistors (also referred to as fourth transistors). The first subtraction circuit is provided between one of a source electrode and a drain electrode of the second transistor and a low potential power source. The second subtraction circuit is provided between one of a source electrode and a drain electrode of the first transistor and a high potential power source. A gate electrode of the subtraction transistor is connected to a drain electrode thereof. Upon input of a signal (first signal) to gate electrodes of the first transistor and the second transistor, a signal (second signal) is outputted from the other of the source electrode and the drain electrode of the first transistor and the other of the source electrode and the drain electrode of the second transistor.

In the aforementioned configuration, the first transistor is a p-channel transistor, the second transistor is an n-channel transistor, the first subtraction transistor is an n-channel transistor, and the second subtraction transistor is a p-channel transistor.

In addition, in the aforementioned configuration, one terminal of the first subtraction circuit is connected to the one of the source electrode and the drain electrode of the first transistor, and the other terminal of the first subtraction circuit is kept at a potential of the low potential power source. Meanwhile, one terminal of the second subtraction circuit is connected to the one of the source electrode and the drain electrode of the second transistor, and the other terminal of the second subtraction circuit is kept at a potential of the high potential power source.

In all of the aforementioned configurations each including a subtraction circuit, if the subtraction circuit has one subtraction transistor, one terminal of the subtraction circuit corresponds to one of a source electrode and a drain electrode of the subtraction transistor. Meanwhile, the other terminal of the subtraction circuit corresponds to the other of the source electrode and the drain electrode of the subtraction transistor. On the other hand, if the subtraction circuit includes multiple subtraction transistors connected in series, one terminal of the subtraction circuit corresponds to one of a source electrode and a drain electrode of a subtraction transistor which is disposed at one end among the multiple subtraction transistors connected in series. Meanwhile, the other terminal of the subtraction circuit corresponds to one of a source electrode and a drain electrode of a subtraction transistor which is disposed at the other end among the multiple subtraction transistors connected in series.

The potential generating circuit included in the semiconductor device of the invention has a first switch, a second switch, a first capacitor, a second capacitor, and a buffer amplifier. One node of the first switch is connected to a high potential power source for generating potentials; the other node of the first switch is connected to one node of the second switch and to one node of the first capacitor; the other node of the second switch is connected to one node of the second capacitor and to an input terminal of the buffer amplifier; and the other terminal of the second capacitor is connected to a low potential power source. Upon input of a subtraction signal (third signal) to the other node of the first capacitor, a fourth signal is outputted from an output node of the buffer amplifier. A potential of the fourth signal corresponds to a potential obtained by subtracting a potential of the subtraction signal from a potential of the high potential power source for generating potentials.

In the aforementioned configuration, the one node of the first switch which is connected to the high potential power source for generating potentials is kept at a potential of the high potential power source for generating potentials (also referred to as a fourth potential).

The potential generating circuit included in the semiconductor device of the invention has multiple resistors connected in series; one end of the multiple resistors is connected to a high potential power source while the other end thereof is connected to a low potential power source; and a potential is outputted from a connecting node of two resistors that are selected from among the multiple resistors.

In the semiconductor device having the aforementioned configuration, the node connected to the high potential power source and the node connected to the low potential power source are kept at constant potentials.

That is, the node connected to the high potential power source (also referred to as first power source) is kept at a potential of the high potential power source (also referred to as a first potential). Meanwhile, the node connected to the low potential power source (also referred to as a second power source) is kept at a potential of the low potential power source (also referred to as a second potential).

The potential generating circuit included in the semiconductor device of the invention generates a potential (also referred to as a third potential) which is different from potentials of the high potential power source and the low potential power source.

An electronic appliance of the invention has a semiconductor device of the invention having any of the aforementioned configurations.

According to the invention having the aforementioned configurations, a potential difference between two signals outputted from an output node can be controlled to be smaller than a potential difference between the high potential power source and the low potential power source. As a result, the power consumption can be reduced.

BRIEF DESCRIPTION OF DRAWINGS

FIGS. 17A and 17B each illustrate a semiconductor device of the invention.

BEST MODE FOR CARRYING OUT THE INVENTION

Figure 1A:
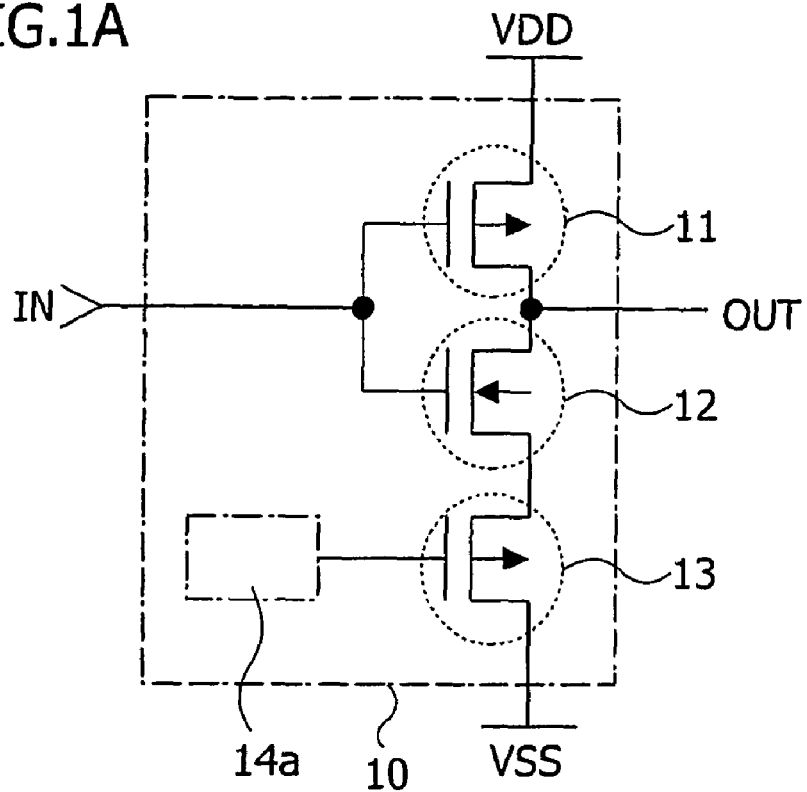
FIGS. 1A and 1B each illustrate a semiconductor device of the invention.

Although the invention will be fully described by way of embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein. Note that in the constitution of the invention which is described below with reference to the drawings, identical portions are denoted by identical reference numerals in different drawings. In addition, in the description below, a high potential power source and a low potential power source are denoted by VDD and VSS respectively in some cases. Further, an input node and an output node are denoted by In and OUT respectively in the drawings.

Embodiment Mode 1

Description is made with reference to the drawings on a configuration of the signal output circuit 10 which is a semiconductor device of the invention. The signal output circuit 10 outputs a signal from an output node (also called an output terminal) upon input of a signal to an input node (also called an input terminal).

The signal output circuit 10 of the invention includes transistors 11, 12 and 13 connected in series, and a potential generating circuit 14*a* (also referred to as a circuit 14*a*) (see FIG. 1A). The transistor 11 is a p-channel transistor, the transistor 12 is an n-channel transistor, and the transistor 13 is a p-channel transistor. The potential generating circuit 14*a* generates a potential Va which is different from potentials of the high potential power source and the low potential power source, and the generated potential Va is outputted to the transistor 13.

One of a source electrode and a drain electrode of the transistor 11 is connected to the high potential power source. A gate electrode of the transistor 13 is connected to the potential generating circuit 14*a*, and one of a source electrode and a drain electrode of the transistor 13 is connected to one of a source electrode and a drain electrode of the transistor 12 while the other of the source electrode and the drain electrode of the transistor 13 is connected to the low potential power source.

The input node of the signal output circuit 10 corresponds to gate electrodes of the transistor 11 and the transistor 12. The output node of the signal output circuit 10 corresponds to the other of the source electrode and the drain electrode of the transistor 11 and to the other of the source electrode and the drain electrode of the transistor 12.

Description is made below on the operation of the signal output circuit 10 having the aforementioned configuration. In the description below, the high potential power source is 10 V, the low potential power source is 0 V, Va is 4 V, and the threshold voltage of the transistor 13 is −1 V. In addition, a potential of an H-level signal is 10 V and a potential of an L-level signal is 0 V.

Upon input of an H-level signal to the input node of the signal output circuit 10, the transistor 11 is turned off while the transistor 12 is turned on. Since a potential of the gate electrode of the transistor 13 is Va (here, 4 V), a potential of the drain electrode thereof is 0 V, and the threshold voltage thereof is −1 V, a potential of the source electrode of the transistor 13 is 5 V. Thus, the signal output circuit 10 outputs a signal of 5 V from the output node thereof.

Upon input of an L-level signal to the input node of the signal output circuit 10, the transistor 11 is turned on while the transistor 12 is turned off, and thus the output node of the signal output circuit 10 outputs a signal of 10 V which is the same level as the potential of VDD.

In the signal output circuit 10 having the aforementioned configuration, a potential difference between two signals outputted from the output node (5 V in the aforementioned example) can be smaller than the potential difference between the high potential power source and the low potential power source (10 V in the aforementioned example). As a result, the power consumption can be reduced.

Figure 1B:
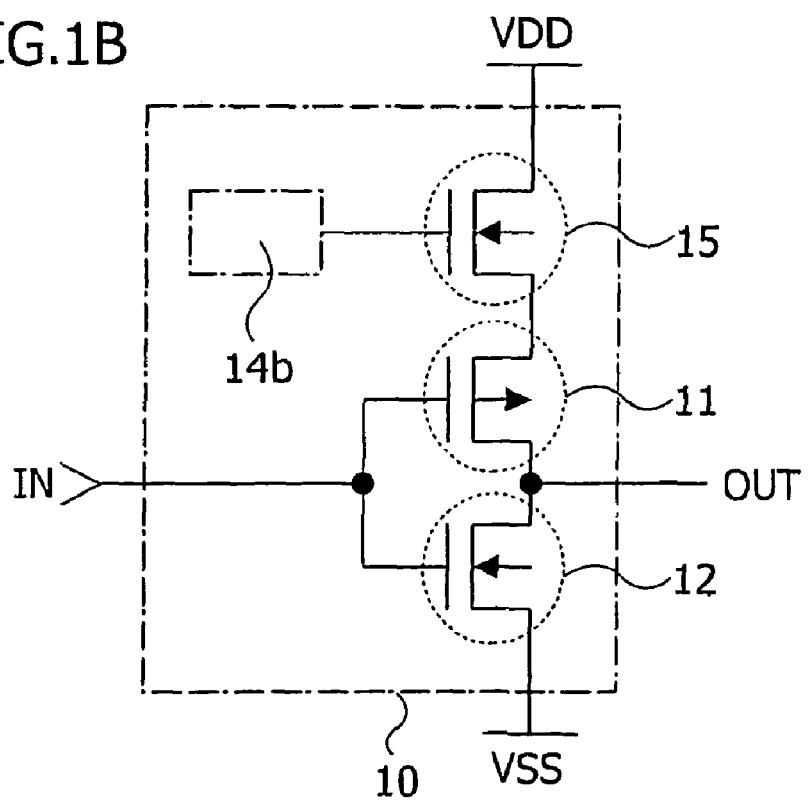

The signal output circuit 10 of the invention includes transistors 11, 12 and 15 connected in series, and the potential generating circuit 14*b* (also referred to as a circuit 14*b*) (see FIG. 1B). The transistor 11 is a p-channel transistor, the transistor 12 is an n-channel transistor, and the transistor 15 is an n-channel transistor. The potential generating circuit 14*b* generates a potential Vb which is different from the potentials of the high potential power source and the low potential power source, and the generated potential Vb is outputted to the transistor 15.

One of the source electrode and the drain electrode of the transistor 12 is connected to the low potential power source. A gate electrode of the transistor 15 is connected to the potential generating circuit 14b, and one of a source electrode and a drain electrode of the transistor 15 is connected to one of the source electrode and the drain electrode of the transistor 11 while the other of the source electrode and the drain electrode of the transistor 15 is connected to the high potential power source.

The input node of the signal output circuit 10 corresponds to the gate electrodes of the transistor 11 and the transistor 12. The output node of the signal output circuit 10 corresponds to the other of the source electrode and the drain electrode of the transistor 11 and to the other of the source electrode and the drain electrode of the transistor 12.

Description is made below on the operation of the signal output circuit 10 having the aforementioned configuration. In the description below, the high potential power source is 16 V, the low potential power source is 0 V, Vb is 10 V, and the threshold voltage of the transistor 15 is 1 V. In addition, a potential of an H-level signal is 16 V and a potential of an L-level signal is 0 V.

Upon input of an H-level signal to the input node of the signal output circuit 10, the transistor 11 is turned off while the transistor 12 is turned on, and the output node of the signal output circuit 10 outputs a signal of 0 V which is the same level as the potential of VSS.

Upon input of an L-level signal to the input node of the signal output circuit 10, the transistor 11 is turned on while the transistor 12 is turned off. Since a potential of the gate electrode of the transistor 15 is Vb (here, 10 V), a potential of the drain electrode thereof is 16 V, and the threshold voltage thereof 1 V, a potential of the source electrode of the transistor 15 is 9 V. Thus, the signal output circuit 10 outputs a signal of 9 V from the output node thereof.

In the signal output circuit 10 having the aforementioned configuration, a potential difference between two signals outputted from the output node (9 V in the aforementioned example) can be smaller than the potential difference between the high potential power source and the low potential power source (16 V in the aforementioned example). As a result, the power consumption can be reduced.

Figure 2:
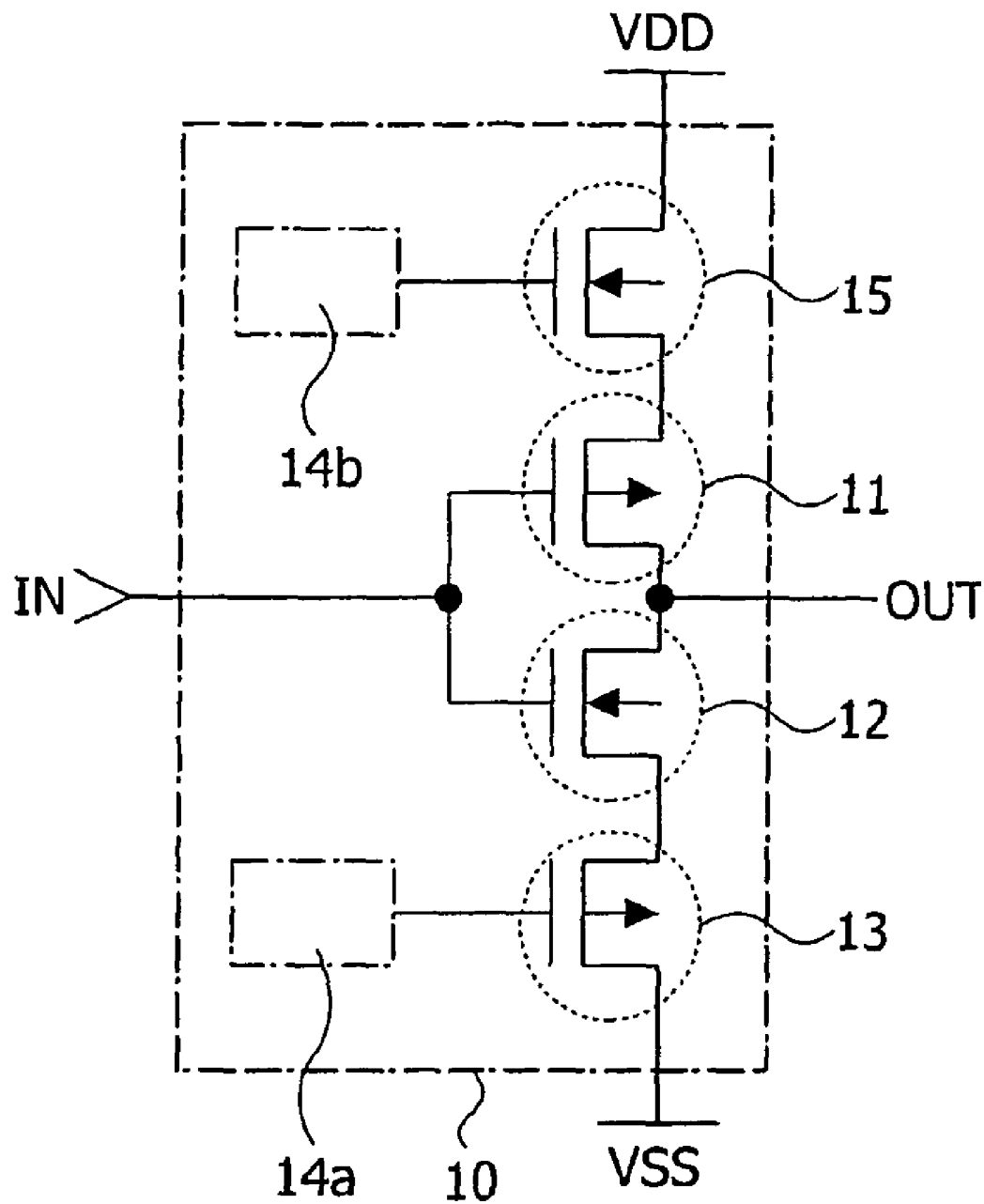
FIG. 2 illustrates a semiconductor device of the invention.

The signal output circuit 10 of the invention includes transistors 11, 12, 13 and 15 connected in series, the potential generating circuit 14a (also referred to as a first circuit 14a), and the potential generating circuit 14b (also referred to as a second circuit 14b) (see FIG. 2). The transistor 11 is a p-channel transistor, the transistor 12 is an n-channel transistor, the transistor 13 is a p-channel transistor, and the transistor 15 is an n-channel transistor. The potential generating circuit 14a generates a potential Va which is different from the potentials of the high potential power source and the low potential power source, and the generated potential Va is outputted to the transistors 13. The potential generating circuit 14b generates a potential Vb which is different from the potentials of the high potential power source and the low potential power source, and the generated potential Vb is outputted to the transistors 15.

The aforementioned configuration of the signal output circuit 10 shown in FIG. 2 is obtained by combining the signal output circuit 10 shown in FIG. 1A and the signal output circuit 10 shown in FIG. 1B. Therefore, description on the operation of the aforementioned signal output circuit 10 shown in FIG. 2 is omitted.

Figure 3:
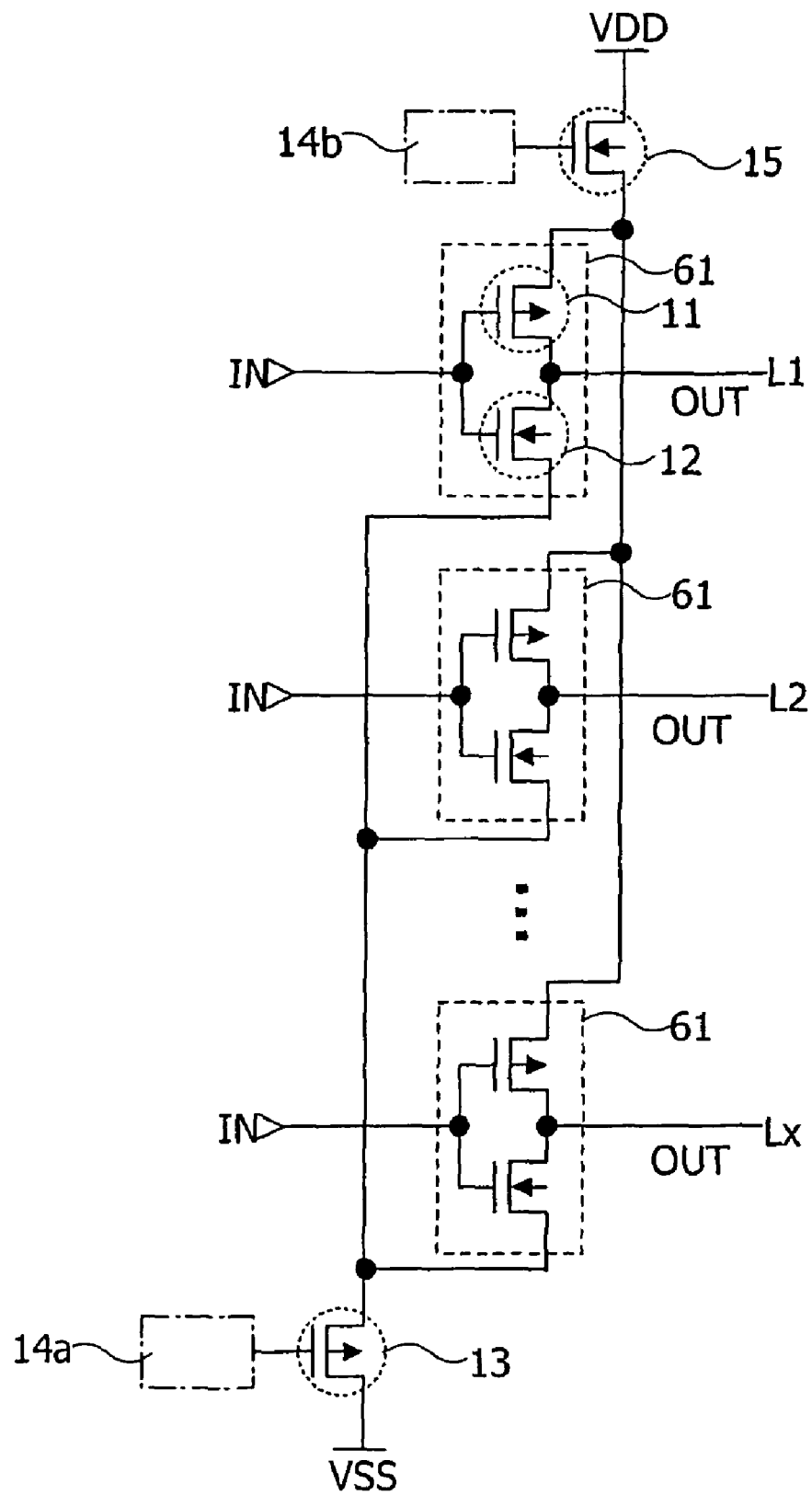
FIG. 3 illustrates a semiconductor device of the invention.

Next, description is made on the case where multiple signal output circuits 10 are provided corresponding to multiple (x, where x is a natural number) wires (L1 to Lx) (see FIG. 3). Note that the multiple wires correspond to, for example, source lines or gate lines, and the multiple signal output circuits 10 are provided in a source driver or a gate driver. In the description below, the multiple signal output circuits 10 each having the configuration shown in FIG. 2 are provided.

In the case of providing the multiple signal output circuits 10, it is preferable to provide only an inverter 61 including the transistors 11 and 12 corresponding to each of the multiple wires (L1 to Lx). In addition, the multiple inverters 61 may share the transistors 13 and 15 and the potential generating circuit 14a and the potential generating circuit 14b. Accordingly, the number of elements can be reduced.

Note that in the aforementioned mode, the transistors 13 and 15 and the potential generating circuit 14a and the potential generating circuit 14b are provided corresponding to the multiple wires (L1 to Lx); however, the invention is not limited to this mode. For example, the multiple wires (L1 to Lx) may be divided into multiple groups, and the transistors 13 and 15 and the potential generating circuit 14a and the potential generating circuit 14b may be provided for each of the multiple groups.

In the aforementioned signal output circuits of the invention shown in FIGS. 1A to 3, a potential difference between two signals outputted from the output node can be controlled to be smaller than a potential difference between the high potential power source and the low potential power source. As a result, the power consumption can be reduced. Note that there is a method of using a power source circuit having a high output current capability such as a series regulator or a charge pump in order to control a potential difference between two signals outputted from the output node to be smaller than a potential difference between the high potential power source and the low potential power source. However, this method cannot achieve sufficient power efficiency to reduce power consumption. Meanwhile, the aforementioned signal output circuits of the invention shown in FIGS. 1A to 3 cause only small power loss, and thus the power consumption can be reduced.

Embodiment Mode 2

Figure 4A:
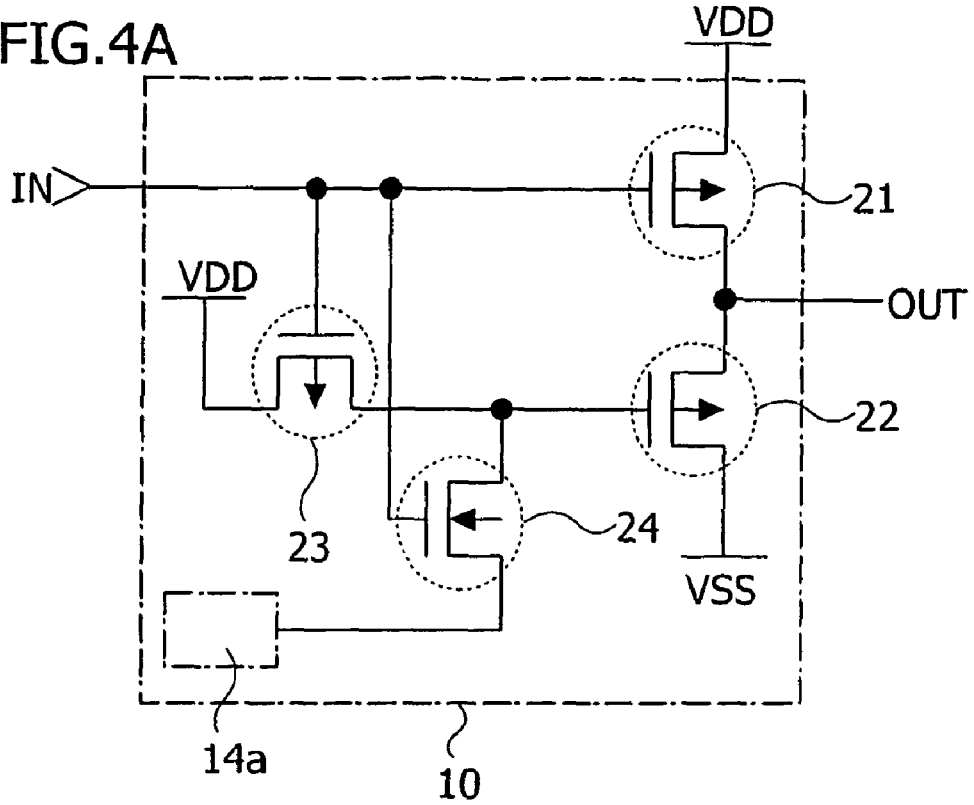
FIGS. 4A and 4B each illustrate a semiconductor device of the invention.

The signal output circuit 10 which is a semiconductor device of the invention includes transistors 21 and 22 connected in series, transistors 23 and 24 connected in series, and the potential generating circuit 14a (also referred to as a circuit 14a) (see FIG. 4A). The transistor 21 is a p-channel transistor, the transistor 22 is a p-channel transistor, the transistor 23 is a p-channel transistor, and the transistor 24 is an n-channel transistor. The potential generating circuit 14a generates a potential Va which is different from the potentials of the high potential power source and the low potential power source, and the generated potential Va is outputted to the transistor 24.

One of a source electrode and a drain electrode of the transistor 21 is connected to the high potential power source. One of a source electrode and a drain electrode of the transistor 22 is connected to the low potential power source. A gate electrode of the transistor 22 is connected to one of a source electrode and a drain electrode of the transistor 23 and to one of a source electrode and a drain electrode of the transistor 24. The other of the source electrode and the drain electrode of the transistor 23 is connected to the high potential power source. The other of the source electrode and the drain electrode of the transistor 24 is connected to the potential generating circuit 14*a*.

An input node of the signal output circuit 10 correspond to gate electrodes of the transistors 21, 23 and 24. An output node of the signal output circuit 10 corresponds to the other of the source electrode and the drain electrode of the transistor 21 and to the other of the source electrode and the drain electrode of the transistor 22.

Description is made below on the operation of the signal output circuit 10 having the aforementioned configuration. In the description below, the high potential power source is 10 V, the low potential power source is 0 V, Va is 4 V, and the threshold voltage of the transistor 22 is −1 V. In addition, a potential of an H-level signal is 10 V and a potential of an L-level signal is 0 V.

Upon input of an H-level signal to the input node of the signal output circuit 10, the transistors 21 and 23 are turned off while the transistor 24 is turned on. Then, the potential Va (here, 4V) is supplied to the gate electrode of the transistor 22 through the transistor 24. Since a potential of the gate electrode of the transistor 22 is 4 V, a potential of the drain electrode thereof is 0 V, and the threshold voltage thereof is −1 V, a potential of the source electrode of the transistor 22 is 5 V. Thus, the signal output circuit 10 outputs a signal of 5 V from the output node thereof.

Upon input of an L-level signal to the input node of the signal output circuit 10, the transistors 21 and 23 are turned on while the transistor 24 is turned off. Then, the potential of the high potential power source is supplied to the gate electrode of the transistor 22 through the transistor 23, thereby the transistor 22 is turned off. Accordingly, the signal output circuit 10 outputs a signal of 10 V which is the same level as the potential of VDD from the output node thereof.

In the signal output circuit 10 having the aforementioned configuration, a potential difference between two signals outputted from the output node (5 V in the aforementioned example) can be smaller than the potential difference between the high potential power source and the low potential power source (10 V in the aforementioned example). As a result, the power consumption can be reduced.

Figure 4B:
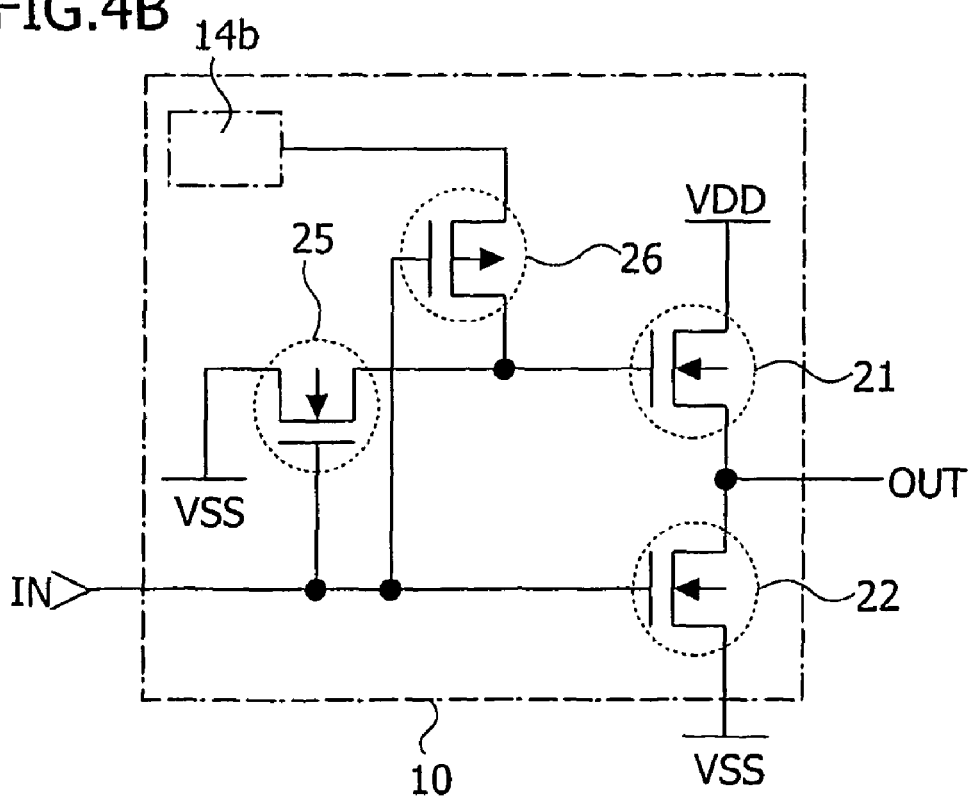

The signal output circuit 10 of the invention includes the transistors 21 and 22 connected in series, transistors 25 and 26 connected in series, and the potential generating circuit 14*b* (also referred to as a circuit 14*b*) (see FIG. 4B). The transistor 21 is an n-channel transistor, the transistor 22 is an n-channel transistor, the transistor 25 is an n-channel transistor, and the transistor 26 is a p-channel transistor. The potential generating circuit 14*b* generates a potential Vb which is different from the potentials of the high potential power source and the low potential power source, and the generated potential Vb is outputted to the transistor 26.

One of the source electrode and the drain electrode of the transistor 21 is connected to the high potential power source. One of the source electrode and the drain electrode of the transistor 22 is connected to the low potential power source. The gate electrode of the transistor 21 is connected to one of a source electrode and a drain electrode of the transistor 25 and to one of a source electrode and a drain electrode of the transistor 26. The other of the source electrode and the drain electrode of the transistor 25 is connected to the low potential power source. The other of the source electrode and the drain electrode of the transistor 26 is connected to the potential generating circuit 14*b*.

An input node of the signal output circuit 10 correspond to gate electrodes of the transistors 22, 25 and 26. An output node of the signal output circuit 10 corresponds to the other of the source electrode and the drain electrode of the transistor 21 and to the other of the source electrode and the drain electrode of the transistor 22.

Description is made below on the operation of the signal output circuit 10 having the aforementioned configuration. In the description below, the high potential power source is 16 V, the low potential power source is 0 V, Vb is 10 V, and the threshold voltage of the transistor 21 is 1 V. In addition, a potential of an H-level signal is 16 V and a potential of an L-level signal is 0 V.

Upon input of an H-level signal to the input node of the signal output circuit 10, the transistors 22 and 25 are turned on while the transistor 26 is turned off. Then, a potential of the low potential power source is supplied to the gate electrode of the transistor 21 through the transistor 25, thereby the transistor 21 is turned off. Thus, the signal output circuit 10 outputs a signal of 0 V which is the same level as the potential of the VSS from the output node thereof.

Upon input of an L-level signal to the input node of the signal output circuit 10, the transistors 22 and 25 are turned off while the transistor 25 is turned on. Then, the potential Vb (here, 10 V) is supplied to the gate electrode of the transistor 21 through the transistor 26. Since a potential of the gate electrode of the transistor 21 is 10 V, a potential of the drain electrode thereof is 16 V, and the threshold voltage thereof is 1 V, a potential of the source electrode of the transistor 21 is 9 V. Accordingly, the signal output circuit 10 outputs a signal of 9 V from the output node thereof.

In the signal output circuit 10 having the aforementioned configuration, a potential difference between two signals outputted from the output node (9 V in the aforementioned example) can be smaller than the potential difference between the high potential power source and the low potential power source (16 V in the aforementioned example). As a result, the power consumption can be reduced.

Figure 5:
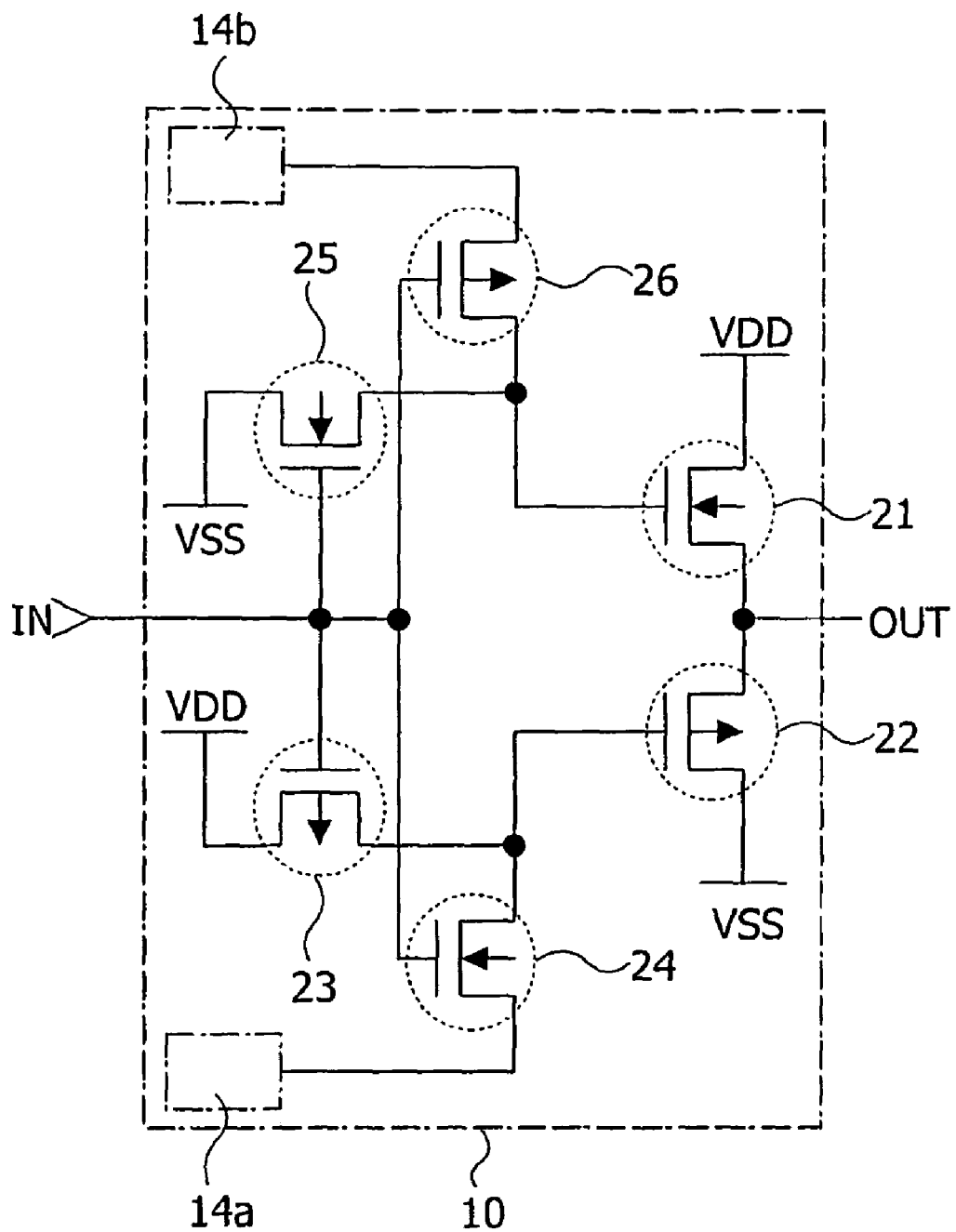
FIG. 5 illustrates a semiconductor device of the invention.

The signal output circuit 10 of the invention includes the transistors 21 and 22 connected in series, the transistors 23 and 24 connected in series, the transistors 25 and 26 connected in series, and the potential generating circuits 14*a* (also referred to as a first circuit 14*a*) and the potential generating circuit 14*b* (also referred to as a second circuit 14*b*) (see FIG. 5). The transistor 21 is an n-channel transistor, the transistor 22 is a p-channel transistor, the transistor 23 is a p-channel transistor, the transistor 24 is an n-channel transistor, the transistor 25 is an n-channel transistor, and the transistor 26 is a p-channel transistor. The potential generating circuit 14*a* generates a potential Va which is different from the potentials of the high potential power source and the low potential power source, and the generated potential Va is outputted to the transistor 24. The potential generating circuit 14*b* generates a potential Vb which is different from the potentials of the high potential power source and the low potential power source, and the generated potential Va is outputted to the transistor 26.

One of the source electrode and the drain electrode of the transistor 21 is connected to the high potential power source. One of the source electrode and the drain electrode of the transistor 22 is connected to the low potential power source. The gate electrode of the transistor 22 is connected to one of the source electrode and the drain electrode of the transistor 23 and to one of the source electrode and the drain electrode of the transistor 24. The other of the source electrode and the drain electrode of the transistor 23 is connected to the high potential power source. The other of the source electrode and the drain electrode of the transistor 24 is connected to the potential generating circuit 14*a*. The gate electrode of the transistor 21 is connected to one of the source electrode and the drain electrode of the transistor 25 and to one of the source electrode and the drain electrode of the transistor 26. The other of the source electrode and the drain electrode of the transistor 25 is connected to the low potential power source. The other of the source electrode and the drain electrode of the transistor 26 is connected to the potential generating circuit 14b.

An input node of the signal output circuit 10 corresponds to the gate electrodes of the transistors 23, 24, 25 and 26. An output node of the signal output circuit 10 corresponds to the other of the source electrode and the drain electrode of the transistor 21 and to the other of the source electrode and the drain electrode of the transistor 22.

Description is made below on the operation of the signal output circuit 10 having the aforementioned configuration. In the description below, the high potential power source is 16 V, the low potential power source is 0 V, Va is 2 V, Vb is 10 V, the threshold voltage of the transistor 21 is 1 V, and the threshold voltage of the transistor 22 is −1 V.

Upon input of an H-level signal to the input node of the signal output circuit 10, the transistor 23 is turned off, the transistor 24 is turned on, the transistor 25 is turned on, and the transistor 26 is turned off. Then, a potential of the low potential power source is supplied to the gate electrode of the transistor 21 through the transistor 25, thereby the transistor 21 is turned off. Meanwhile, the potential Va (here, 2 V) is supplied to the gate electrode of the transistor 22 through the transistor 24. Since a potential of the gate electrode of the transistor 22 is 2 V, a potential of the drain electrode thereof is 0 V, and the threshold voltage thereof is −1 V, a potential of the source electrode of the transistor 22 is 3 V. Accordingly, the signal output circuit 10 outputs a signal of 3 V from the output node thereof.

Upon input of an L-level signal to the input node of the signal output circuit 10, the transistor 23 is turned on, the transistor 24 is turned off, the transistor 25 is turned off, and the transistor 26 is turned on. Then, the potential of the high potential power source is supplied to the gate electrode of the transistor 22 through the transistor 23, thereby the transistor 22 is turned off. Meanwhile, the potential Vb (here, 10 V) is supplied to the gate electrode of the transistor 21 through the transistor 26. Since a potential of the gate electrode of the transistor 21 is 10 V, a potential of the drain electrode thereof is 16 V, and the threshold voltage thereof is 1 V, a potential of the source electrode of the transistor 21 is 9 V. Accordingly, the signal output circuit 10 outputs a signal of 9 V from the output node thereof.

In the signal output circuit 10 having the aforementioned configuration, a potential difference between two signals outputted from the output node (9 V in the aforementioned example) can be smaller than the potential difference between the high potential power source and the low potential power source (16 V in the aforementioned example). As a result, the power consumption can be reduced.

Note that in the case of providing multiple signal output circuits 10 having the aforementioned configuration shown in FIG. 4A, 4B or 5, the potential generating circuit 14a and the potential generating circuit 14b are not required to be provided in each signal output circuit 10, but may be shared by the multiple signal output circuits 10. Accordingly, the number of elements can be reduced.

Note that there is a method of using a power source circuit having a high output current capability such as a series regulator or a charge pump in order to control a potential difference between two signals outputted from the output node to be smaller than a potential difference between the high potential power source and the low potential power source. However, this method cannot achieve sufficient power efficiency to reduce power consumption. Meanwhile, the aforementioned signal output circuits of the invention shown in FIGS. 4A to 5 cause only small power loss, and thus the power consumption can be reduced.

Embodiment Mode 3

Figure 6A:
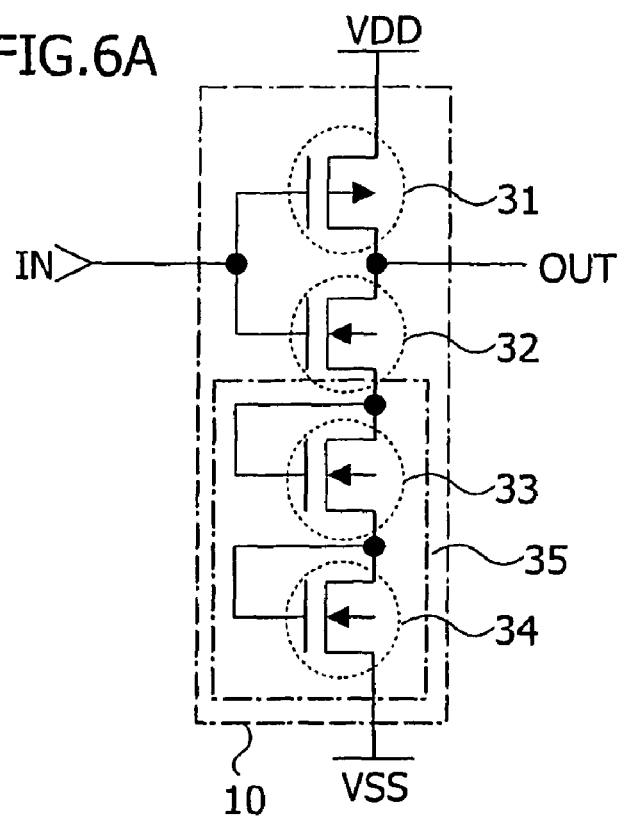
FIGS. 6A and 6B each illustrate a semiconductor device of the invention.

The signal output circuit 10 which is a semiconductor device of the invention includes transistors 31 and 32 connected in series, and a subtraction circuit 35 including one or more subtraction transistors (see FIG. 6A). The transistor 31 is a p-channel transistor, the transistor 32 is an n-channel transistor, and the one or more subtraction transistors included in the subtraction circuit 35 is/are n-channel transistors. In the shown configuration, the subtraction circuit 35 includes two subtraction transistors 33 and 34 connected in series.

One of a source electrode and a drain electrode of the transistor 31 is connected to the high potential power source. The subtraction circuit 35 is provided between one of a source electrode and a drain electrode of the transistor 32 and the low potential power source. A gate electrode of the subtraction transistor 33 is connected to one of a source electrode and a drain electrode of the subtraction transistor 33. Similarly, a gate electrode of the subtraction transistor 34 is connected to one of a source electrode and a drain electrode of the subtraction transistor 34.

An input node of the signal output circuit 10 corresponds to gate electrodes of the transistor 31 and the transistor 32. An output node of the signal output circuit 10 corresponds to the other of the source electrode and the drain electrode of the transistor 31 and to the other of the source electrode and the drain electrode of the transistor 32.

Description is made below on the operation of the signal output circuit 10 having the aforementioned configuration. In the description below, the high potential power source is 10 V, the low potential power source is 0 V, the threshold voltage of the transistor 33 is 2 V and the threshold voltage of the transistor 34 is 2 V. In addition, a potential of an H-level signal is 10 V and a potential of an L-level signal is 0 V.

Upon input of an H-level signal to the input node of the signal output circuit 10, the transistors 31 is turned off while the transistor 32 is turned on. Since a potential of the source electrode of the transistor 34 is 0 V and the threshold voltage thereof is 2 V, a potential of the drain electrode of the transistor 34 is 2 V. In addition, since a potential of the source electrode of the transistor 33 is 2 V and the threshold voltage thereof is 2 V, a potential of the drain electrode of the transistor 33 is 4 V. Thus, the signal output circuit 10 outputs a signal of 4 V from the output node thereof.

Upon input of an L-level signal to the input node of the signal output circuit 10, the transistor 31 is turned on while the transistor 32 is turned off, and the output node of the signal output circuit 10 outputs a signal of 10 V which is the same level as the potential of VDD.

In the signal output circuit 10 having the aforementioned configuration, a potential difference between two signals outputted from the output node (6 V in the aforementioned example) can be smaller than the potential difference between the high potential power source and the low potential power source (10 V in the aforementioned example). As a result, the power consumption can be reduced.

Figure 6B:
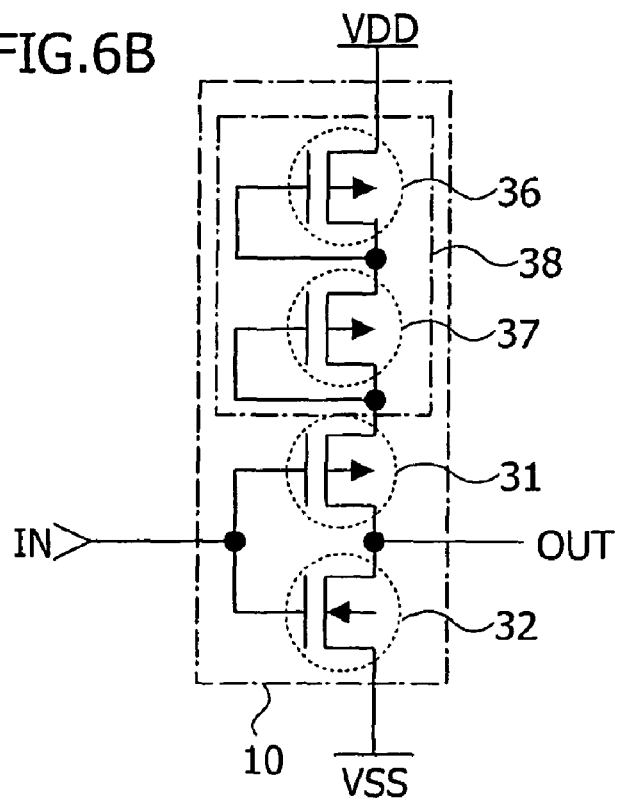

The signal output circuit 10 of the invention includes the transistors 31 and 32 connected in series, and a subtraction circuit 38 including one or more subtraction transistors (see FIG. 6B). The transistor 31 is a p-channel transistor, the transistor 32 is an n-channel transistor, and the one or more subtraction transistors included in the subtraction circuit 38 is/are p-channel transistors. In the shown configuration, the subtraction circuit 38 includes two subtraction transistors 36 and 37 connected in series.

One of the source electrode and the drain electrode of the transistor 32 is connected to the low potential power source. The subtraction circuit 38 is provided between one of the source electrode and the drain electrode of the transistor 31 and the high potential power source. A gate electrode of the subtraction transistor 36 is connected to one of a source electrode and a drain electrode of the subtraction transistor 36. A gate electrode of the subtraction transistor 37 is connected to one of a source electrode and a drain electrode of the subtraction transistor 37.

An input node of the signal output circuit 10 corresponds to the gate electrodes of the transistor 31 and the transistor 32. An output node of the signal output circuit 10 corresponds to the other of the source electrode and the drain electrode of the transistor 31 and to the other of the source electrode and the drain electrode of the transistor 32.

Description is made below on the operation of the signal output circuit 10 having the aforementioned configuration. In the description below, the high potential power source is 10 V, the low potential power source is 0 V, the threshold voltage of the transistor 36 is −2 V and the threshold voltage of the transistor 37 is −2 V. In addition, a potential of an H-level signal is s 10 V and a potential of an L-level signal is 0 V.

Upon input of an H-level signal to the input node of the signal output circuit 10, the transistor 31 is turned off while the transistor 32 is turned on, and the signal output circuit 10 outputs a signal of 0 V which is the same level as the potential of VSS.

Upon input of an L-level signal to the input node of the signal output circuit 10, the transistor 31 is turned on, and the transistor 32 is turned off. Since a potential of the source electrode of the transistor 36 is 10 V and the threshold voltage thereof is −2 V, a potential of the drain electrode of the transistor 36 is 8 V. In addition, since a potential of the source electrode of the transistor 37 is 8 V and the threshold voltage thereof is −2 V, a potential of the drain electrode of the transistor 37 is 6 V. Thus, the signal output circuit 10 outputs a signal of 6 V from the output node thereof.

In the signal output circuit 10 having the aforementioned configuration, a potential difference between two signals outputted from the output node (6 V in the aforementioned example) can be smaller than the potential difference between the high potential power source and the low potential power source (10 V in the aforementioned example). As a result, the power consumption can be reduced.

Figure 7:
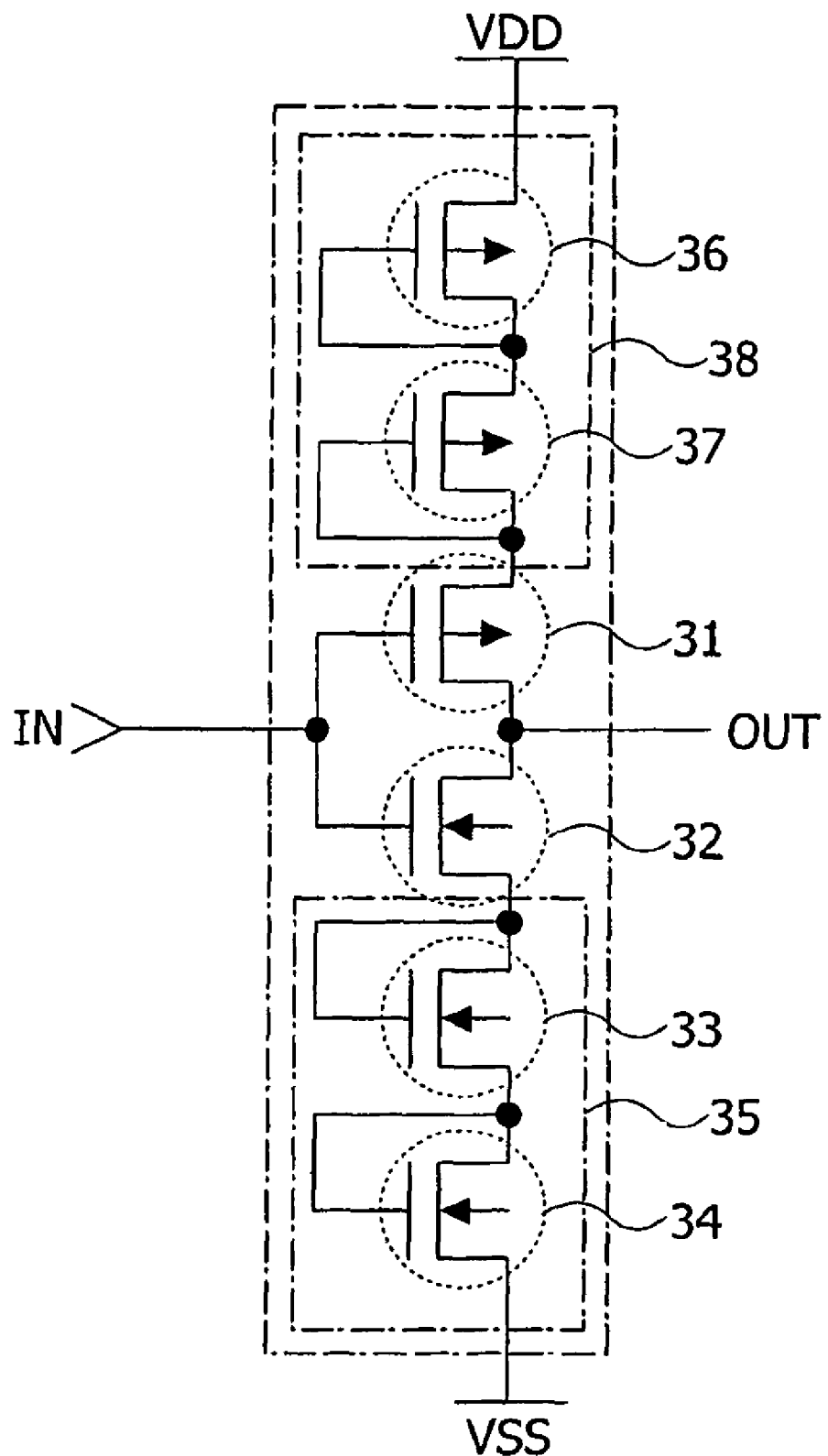
FIG. 7 illustrates a semiconductor device of the invention.

The signal output circuit 10 of the invention includes the transistors 31 and 32 connected in series, the subtraction circuit 35 including one or more subtraction transistors, and the subtraction circuit 38 including one or more subtraction transistors (see FIG. 7). In the shown configuration, the subtraction circuit 35 includes the two subtraction transistors 33 and 34 connected in series while the subtraction circuit 38 includes the two subtraction transistors 36 and 37 connected in series.

The subtraction circuit 35 is provided between one of the source electrode and the drain electrode of the transistor 32 and the low potential power source. Meanwhile, the subtraction circuit 38 is provided between one of the source electrode and the drain electrode of the transistor 31 and the high potential power source.

The aforementioned configuration of the signal output circuit 10 shown in FIG. 7 is obtained by combining the signal output circuit 10 shown in FIG. 6A and the signal output circuit 10 shown in FIG. 6B. Therefore, description on the operation of the aforementioned signal output circuit 10 shown in FIG. 7 is omitted.

Note that each of the aforementioned signal output circuits 10 shown in FIGS. 6A, 6B and 7 can be used as the potential generating circuit 14a and the potential generating circuit 14b.

Figure 8:
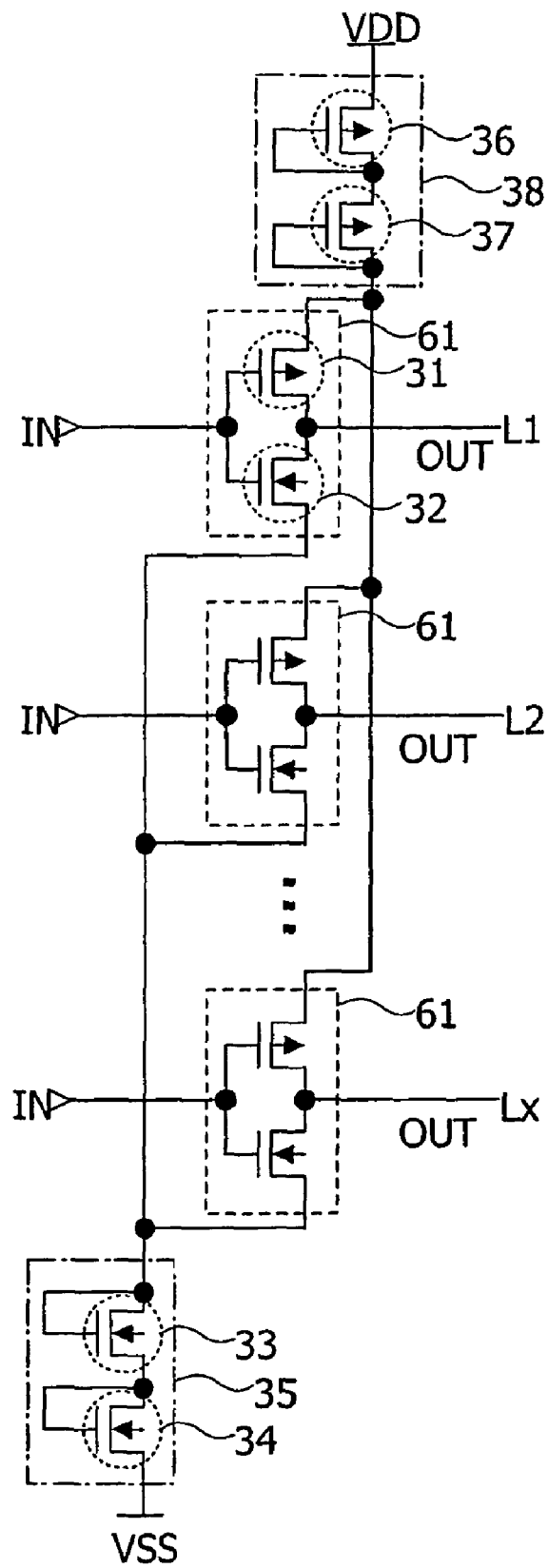
FIG. 8 illustrates a semiconductor device of the invention.

Next, description is made on the case where the multiple signal output circuits 10 are provided corresponding to multiple (x, where x is a natural number) wires (L1 to Lx) (see FIG. 8). Note that the multiple wires correspond to, for example, source lines or gate lines, and the multiple signal output circuits 10 are provided in a source driver or a gate driver. In the description below, the multiple signal output circuits 10 having the configuration shown in FIG. 7 are provided.

In the case of providing the multiple signal output circuits 10, it is preferable to provide only the inverter 61 including the transistors 31 and 32 corresponding to each of the multiple wires (L1 to Lx). Then, the multiple inverters 61 may share the subtraction circuit 35 including the transistors 33 and 34 and the subtraction circuit 38 including the transistors 36 and 37. Accordingly, the number of elements can be reduced.

Note that in the aforementioned mode, the subtraction circuits 35 and 38 are provided corresponding to the multiple wires (L1 to Lx); however, the invention is not limited to this mode. For example, the multiple wires (L1 to Lx) may be divided into multiple groups, and the subtraction circuits 35 and 38 may be provided for each of the multiple groups.

In the aforementioned signal output circuits of the invention shown in FIGS. 6A to 8, a potential difference between two signals outputted from the output node can be controlled to be smaller than a potential difference between the high potential power source and the low potential power source. As a result, the power consumption can be reduced. Note that there is a method of using a power source circuit having a high output current capability such as a series regulator or a charge pump in order to control a potential difference between two signals outputted from the output node to be smaller than a potential difference between the high potential power source and the low potential power source. However, this method cannot achieve sufficient power efficiency to reduce power consumption. Meanwhile, the aforementioned signal output circuits of the invention shown in FIGS. 6A to 8 cause only small power loss, and thus the power consumption can be reduced.

In addition, the signal output circuits of the invention shown in FIGS. 6A to 8 have an advantage in that a potential generating circuit is not required as compared to the configurations shown in Embodiment Modes 1 and 2.

Embodiment Mode 4

Figure 9:
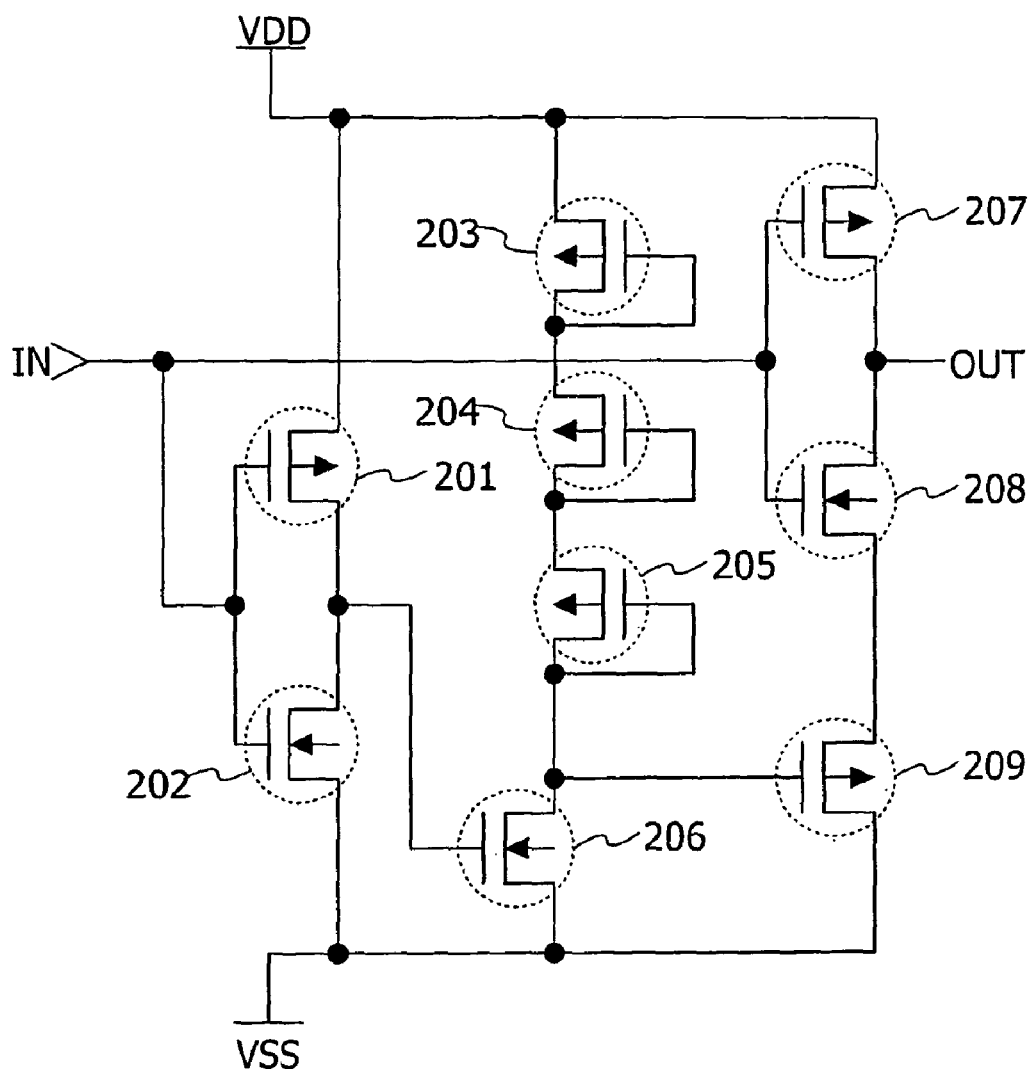
FIG. 9 illustrates a semiconductor device of the invention.

A semiconductor device of the invention includes transistors 201 to 209 (see FIG. 9). The transistors 201, 203 to 205, 207 and 209 are p-channel transistors while the transistors 202, 206 and 208 are n-channel transistors.

Description is made on the operation of the semiconductor device having the aforementioned configuration. In the description below, the low potential power source is 0 V, and all the transistors 203 to 205 and 209 have the same threshold voltage value (|VTHa|).

Upon input of an H-level signal to the input node, the transistor 201 is turned off, the transistor 202 is turned on, the transistor 207 is turned off, and the transistor 208 is turned on.

A drain electrode of the transistor 206 has a potential which is obtained by subtracting the threshold voltages of the transistors 203 to 205 from the high potential power source (VDD): (VDD−|VTHa|−VTHa|−VTHa|), and this potential is supplied to a gate electrode of the transistor 209. Since a drain electrode of the transistor 209 has the same potential as the low potential power source (0 V), a source electrode of the transistor 209 has a potential of (VDD−|VTHa|−|VTHa|), and a signal having the potential of (VDD−|VTHa|−|VTHa|) is outputted from the output node.

Upon input of an L-level signal to the input node, the transistor 201 is turned on, the transistor 202 is turned off, the transistor 207 is turned on, and the transistor 208 is turned off, thereby a signal having the same potential as the high potential power source (VDD) is outputted from the output node.

Figure 10:
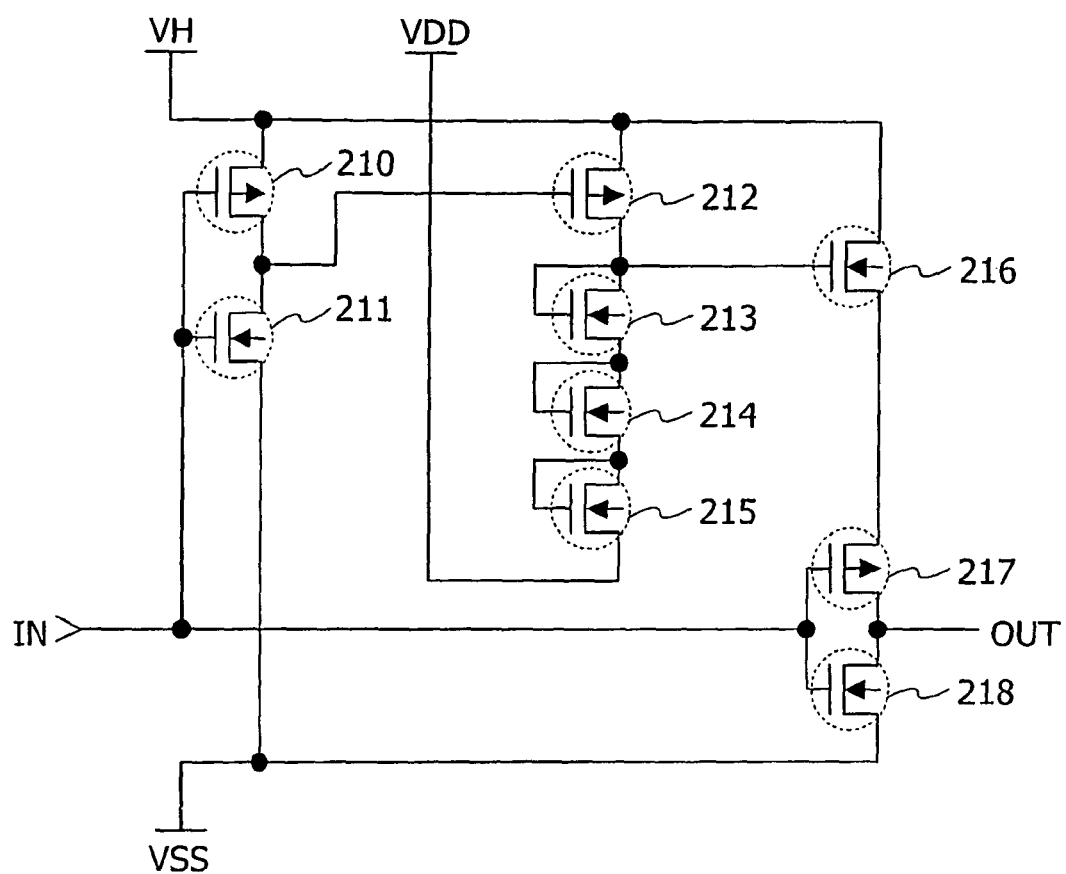
FIG. 10 illustrates a semiconductor device of the invention.

The semiconductor device of the invention having a different configuration from the aforementioned has transistors 210 to 218 (see FIG. 10). The transistors 210, 212 and 217 are p-channel transistors while the transistors 211, 213 to 216 and 218 are n-channel transistors.

Description is made on the operation of the semiconductor device having the aforementioned configuration. In the description below, all the transistors 213 to 215 and 216 have the same threshold voltage value (|VTHa|).

Upon input of an H-level signal to the input node, the transistor 201 is turned off, the transistor 211 is turned on, the transistor 217 is turned off, and the transistor 218 is turned on. Then, a signal having the same potential as the low potential power source (VSS) is outputted from the output node.

Upon input of an L-level signal to the input node, the transistor 210 is turned on, the transistor 211 is turned off, the transistor 217 is turned on, and the transistor 218 is turned off. A drain electrode of the transistor 212 has a potential which is obtained by adding the high potential power source (VDD) to the threshold voltages of the transistors 213 to 215: (VDD+ VTHb+VTHb+VTHb), and this potential is supplied to a gate electrode of the transistor 216. Then, a source electrode of the transistor 216 has a potential value of (VDD+VTHb+VTHb), and a signal having the potential of (VDD+VTHb+VTHb) is outputted from the output node.

Figure 11:
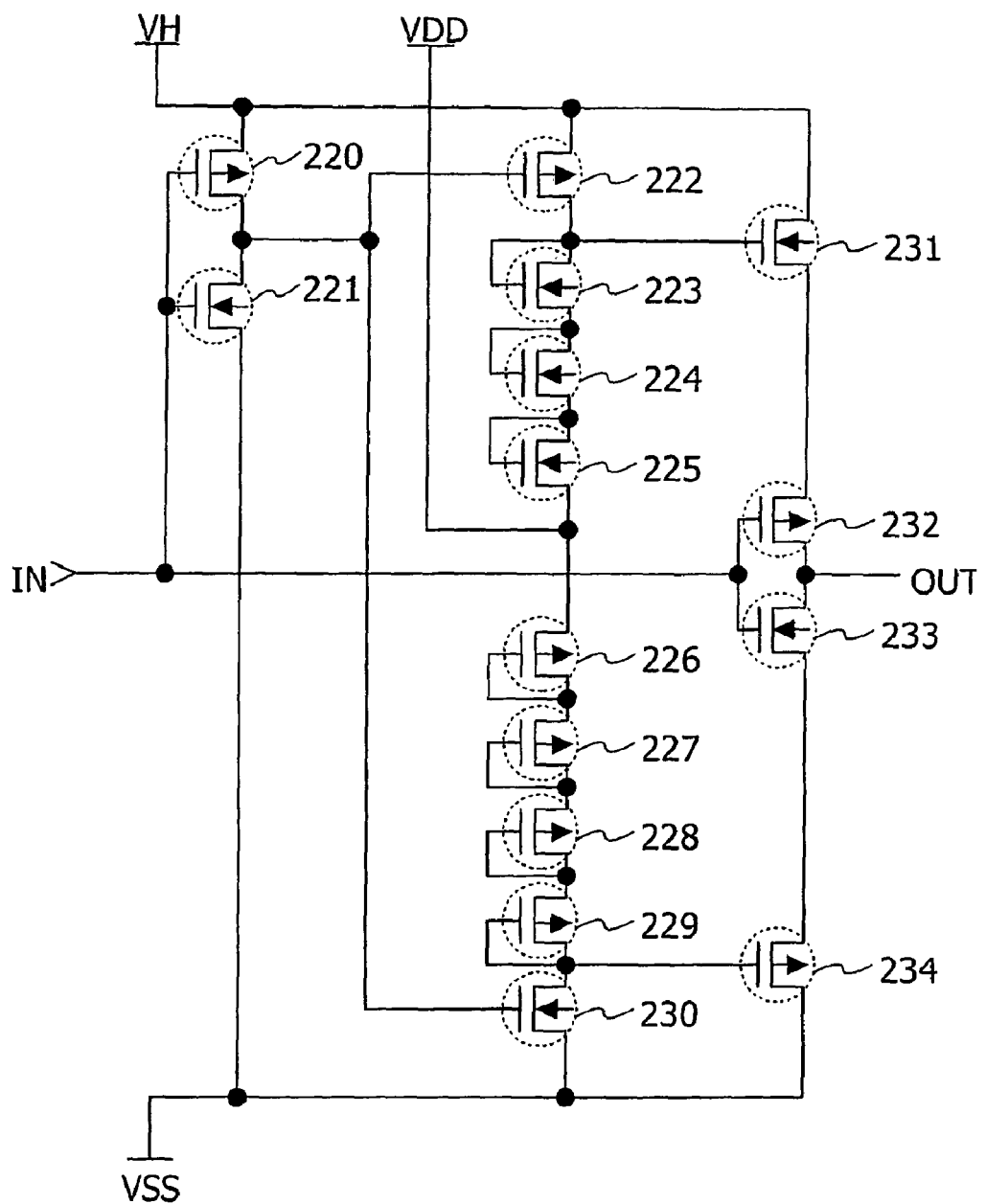
FIG. 11 illustrates a semiconductor device of the invention.

A semiconductor device having a different configuration from the aforementioned includes transistors 220 to 234 (see FIG. 11). The transistors 220, 222, 226 to 229, 232 and 234 are p-channel transistors while the transistors 221, 223 to 225, 230, 231 and 233 are n-channel transistors.

Description is made on the operation of the semiconductor device having the aforementioned configuration. In the description below, all the transistors 223 to 225 and 231 have the same threshold voltage value (|VTHa|), while all the transistors 226 to 229 and 234 have the same threshold voltage value (|VTHb|).

Upon input of an H-level signal to the input node, the transistor 220 is turned off, the transistor 221 is turned on, the transistor 232 is turned off, and the transistor 222 is turned on. A drain electrode of the transistor 230 has a potential which is obtained by subtracting the threshold voltages of the transistors 226 to 229 from the high potential power source (VDD): (VDD−|VTHa|−|VTHa|−|VTHa|−|VTHa|), and this potential is supplied to a gate electrode of the transistor 234. Since a drain electrode of the transistor 234 has the same potential as the low potential power source (0 V), and a source electrode of the transistor 234 has a potential value of (VDD−|VTHa|−|VTHa|−|VTHa|), a signal having the potential of (VDD−|VTHa|−|VTHa|−|VTHa|) is outputted from the output node.

Upon input of an L-level signal to the input node, the transistor 220 is turned on, the transistor 221 is turned off, the transistor 232 is turned on, and the transistor 222 is turned off. A drain electrode of the transistor 222 has a potential which is obtained by adding the high potential power source (VDD) to the threshold voltages of the transistors 223 to 225: (VDD+ VTHb+VTHb+VTHb), and this potential is supplied to a gate electrode of the transistor 231. Then, a source electrode of the transistor 231 has a potential value of (VDD+VTHb+VTHb), and a signal having a potential of (VDD+VTHb+VTHb) is outputted from the output node.

Note that each of the transistors 203 to 305, the transistors 213 to 215, the transistors 223 to 225, and the transistors 226 to 229 is a transistor of which gate electrode and drain electrode are connected to each other. These transistors are provided in order to generate a potential lower or higher than the high potential power source, and the number of such transistors is not specifically limited.

Embodiment Mode 5

Figure 12A:
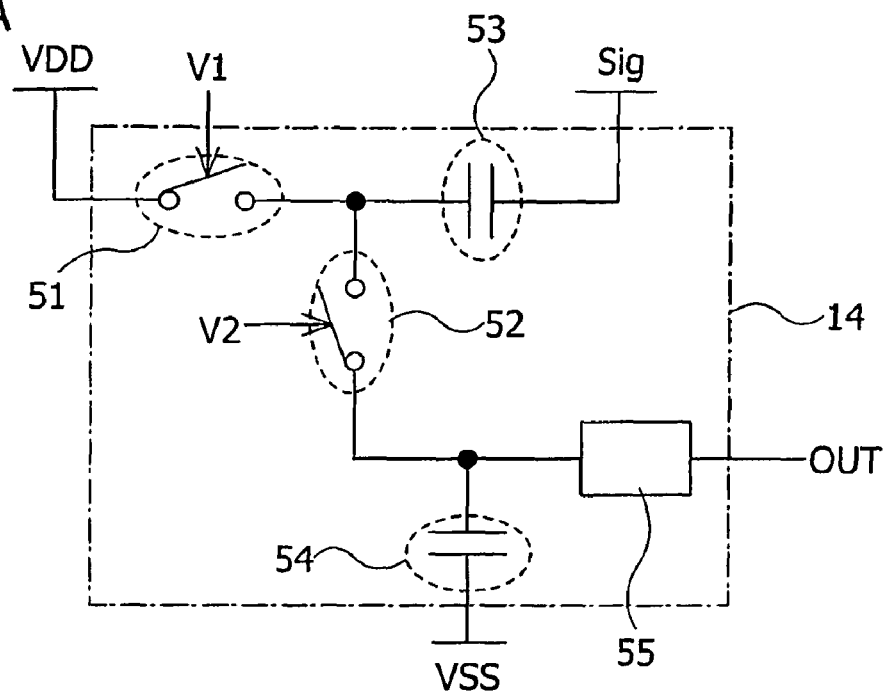
FIGS. 12A and 12B each illustrate a semiconductor device of the invention.
Figure 12B:
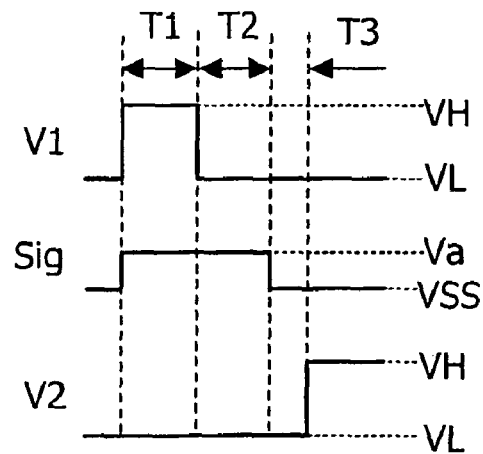

Description is made with reference to FIGS. 12A and 12B on a configuration of a potential generating circuit which is a component of the invention.

The potential generating circuit 14 includes switches 51 and 52, capacitors 53 and 54 and a circuit 55 (see FIG. 12A). The switches 51 and 52 are the elements having a switching function, such as transistors or analog switches. The circuit 55 is a circuit having high input impedance such as a buffer amplifier, where a potential inputted to an input node is equal to a potential outputted from an output node. The buffer amplifier has three terminals of an input terminal, an inverting input terminal and an output terminal. The inverting input terminal and the output terminal are connected to each other.

One node of the switch 51 is connected to a high potential power source (VDD) for generating potentials. The other node of the switch 51 is connected to one node of the switch 52 and one node of the capacitor 53. The other node of the switch 52 is connected to one node of the capacitor 54 and the input node of the circuit 55. The other node of the capacitor 54 is connected to the low potential power source (VSS). The other node of the capacitor 53 receives a subtraction signal (Sig). The switch 51 receives a signal having a potential (V1) while the switch 52 receives a signal having a potential (V2).

Next, description is made on the operation of the potential generating circuit 14 having the aforementioned configuration (see FIG. 12B). Note that the switches 51 and 52 are turned on (become conductive) upon receiving an H-level signal (VH) while they are turned off (become non-conductive) upon receiving an L-level signal (VL).

In a period (period T1) in which the switch 51 is on, the switch 52 is off, and a potential of the subtraction signal is at Va, a potential of the connecting node of the switches 51 and 52 drops gradually from the high potential power source (VDD) for generating potentials toward a potential of (VDD−(Va−VSS)).

Next, in a period (period T2) in which the switch 51 is off, the switch 52 is off, and a potential of the subtraction signal is at Va, the operation in the period T1 is still carried on, and thus the potential of the connecting node of the switches 51 and 52 drops gradually from the high potential power source (VDD) for generating potentials toward the potential of (VDD−(Va−VSS)). When the potential of the subtraction signal changes from Va to VSS, the potential of the connecting node of the switches 51 and 52 becomes (VDD−(Va−VSS)).

Then, in a period (period T3) in which the switch 51 is off, the switch 52 is on, and a potential of the subtraction signal is at VSS, the potential generated in the period T2 (VDD−(Va−

VSS) is inputted to the input node of the circuit 55. Then, the potential of (VDD−(Va−VSS)) is outputted from the output node of the circuit 55.

Embodiment Mode 6

Figure 13:
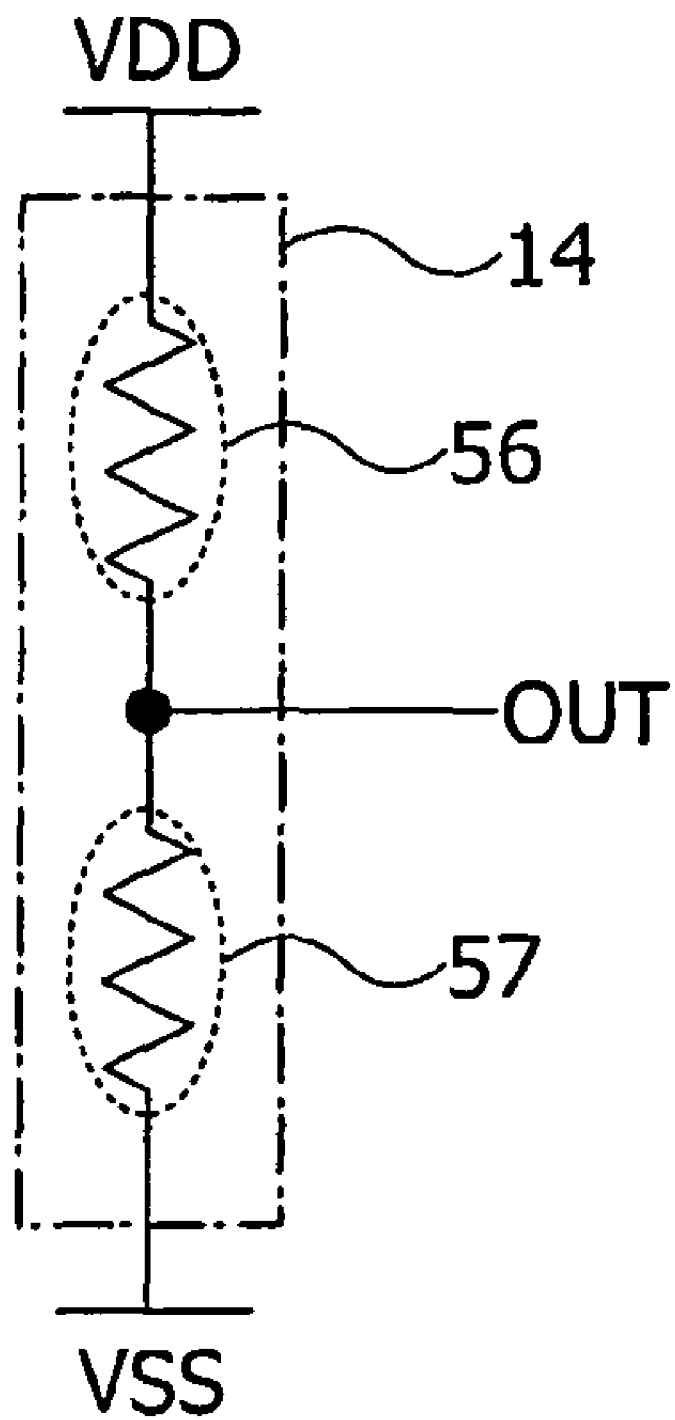
FIG. 13 illustrates a semiconductor device of the invention.

Description is made with reference to FIG. 13 on a configuration of a potential generating circuit which is a component of the semiconductor device of the invention.

The potential generating circuit 14 has multiple resistors connected in series. One end of the multiple resistors connected in series is connected to the high potential power source (VDD) while the other end thereof is connected to the low potential power source (VSS). The potential generating circuit 14 outputs potentials from a connecting node of two resistors that are selected from among the multiple resistors. The aforementioned configuration corresponds to a circuit utilizing resistance division, in which a new potential is generated by utilizing a potential of the high potential power source or the low potential power source.

In the shown configuration, the potential generating circuit 14 has resistors 56 and 57 connected in series. One node of the resistor 56 is connected to the high potential power source, and one node of the resistor 57 is connected to the low potential power source. A potential is outputted from a connecting node of the other node of the resistor 56 and the other node of the resistor 57.

Embodiment Mode 7

Figure 21:
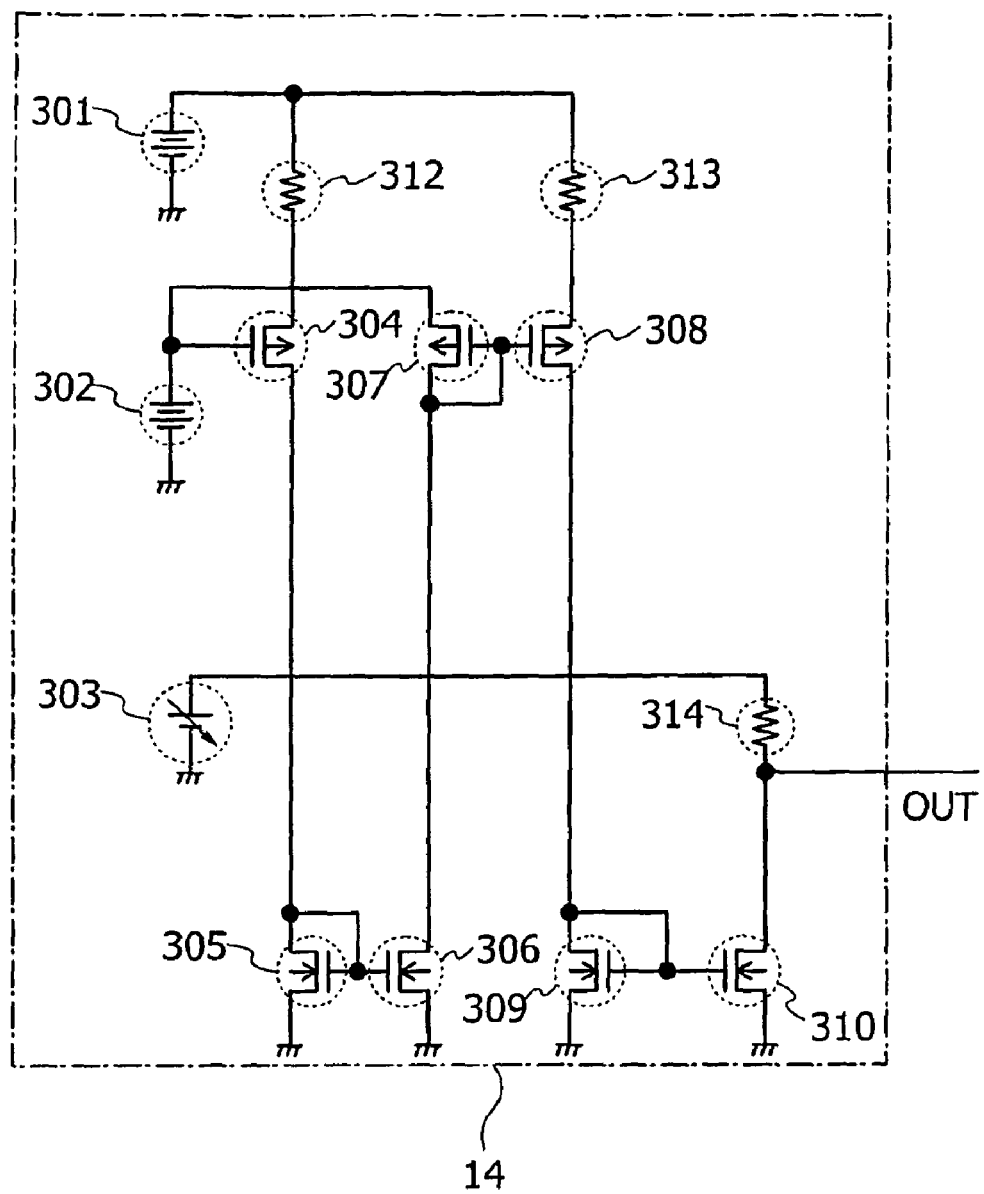
FIG. 21 illustrates a semiconductor device of the invention.

Description is made with reference to FIG. 21 on a configuration of the potential generating circuit 14 which is a component of the invention.

The potential generating circuit 14 includes power sources 301 to 303, transistors 304 to 310, and resistors 312 to 314. The power sources 301 and 302 are fixed power sources while the power source 303 is a variable power source. The transistors 304, 307 and 308 are p-channel transistors while the transistors 305, 306, 309 and 310 are n-channel transistors.

The transistors 305 and 306, the transistors 307 and 308, and the transistors 309 and 310 each are current mirror circuits. The two transistors which are a current mirror circuit have the same current value.

The power source 301 outputs a potential Va, the power source 302 outputs a potential Vb, and the power source 303 outputs a potential Vc (the potentials Va and Vb satisfy Va>Vb).

Description is made below on the operation of the potential generating circuit 14 having the aforementioned configuration. In the description below, all the transistors 304, 307 and 308 have the same threshold voltage value (|VTHa|) while all the transistors 305, 306, 309 and 310 have the same threshold voltage value (VTHb). In addition, the resistance values of the resistors 312 and 313 are each R1 while the resistance value of the resistor 314 is R2.

Since a gate electrode of the transistor 304 has the same level as the potential Vb, a drain electrode of the transistor 304 has a potential which is obtained by adding the potential Vb to the threshold voltage: (Vb+|VTHa|). In addition, since a source electrode of the transistor 307 has the level as the potential Vb, drain and gate electrodes of the transistor 307 have a potential which is obtained by subtracting the threshold voltage from the potential Vb: (Vb−|VTHa|). Further, since a gate electrode of the transistor 308 has a potential of (Vb−|VTHa|), a source electrode of the transistor 308 has a potential Vb which is obtained by subtracting the threshold voltage from the potential of the gate electrode.

One node of the resistor 313 receives the potential Va while the other node thereof receives the potential Vb, and thus the resistor 313 has a current value obtained by subtracting the potential Vb from the potential Va and then dividing it by the resistance value R1: ((Va−Vb)/R1).

The resistor 313 and the transistors 309 and 310 have the same current value. Since one node of the resistor 314 has a potential of Vc, the other node of the resistor 314 has a potential of (Vc−(Va−Vb)×R2/R1).

In this manner, the potential generating circuit 14 can generate a new potential (Vc−(Va−Vb)×R2/R1) which is different from the potentials Va and Vb. In addition, since a potential generated by the potential generating circuit 14 has no relation to the threshold voltage value of transistors, it is not affected by variations in the threshold voltage of the transistors.

Embodiment Mode 8

Figure 22:
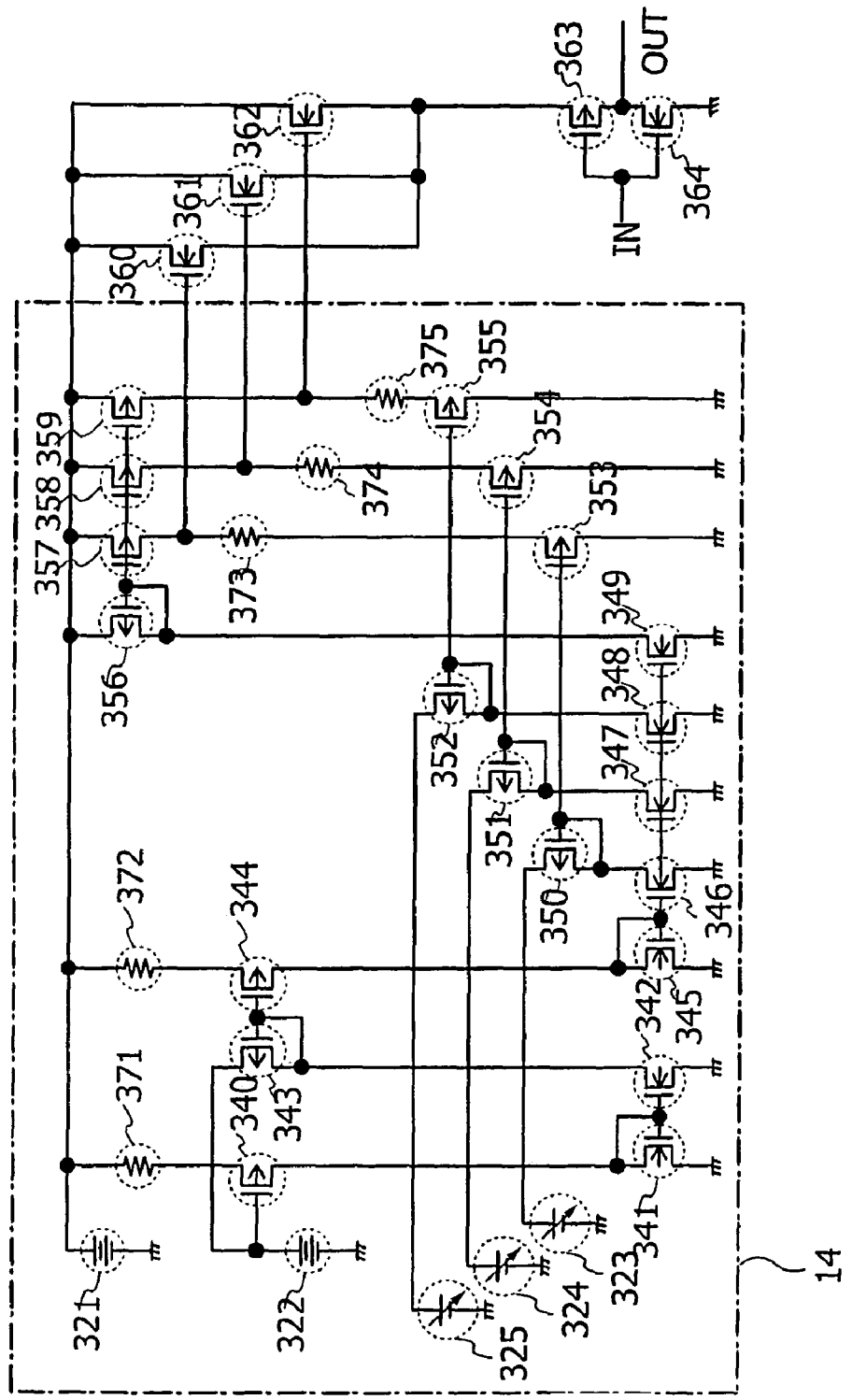
FIG. 22 illustrates a semiconductor device of the invention.

Description is made with reference to FIG. 22 on a signal output circuit which is a component of the invention.

The signal output circuit includes transistors 360 to 364 and the potential generating circuit 14. The transistors 360 to 362 and 364 are n-channel transistors while the transistor 363 is a p-channel transistor. The signal output circuit outputs a signal from its output node upon input of a signal to an input node thereof.

Description is made with reference to FIG. 22 on the potential generating circuit 14.

The potential generating circuit 14 includes power sources 321 to 325, transistors 340 to 359, and resistors 371 to 375. The power sources 321 and 322 are fixed power sources while the power sources 323 to 325 are variable power sources. The transistors 340, 343, 344 and 350 to 359 are p-channel transistors while the transistors 341, 342 and 346 to 369 are n-channel transistors. The transistors 341 and 342, the transistors 343 and 344, the transistors 345 to 349, the transistors 350 and 353, the transistors 351 and 354, the transistors 352 and 355, and the transistors 356 to 359 each are current mirror circuits. The two transistors which are a current mirror circuit have the same current value.

The power source 321 outputs a potential Va, the power source 322 outputs a potential Vb, the power source 323 outputs a potential Vc, the power source 324 outputs a potential Vd, and the power source 325 outputs a potential Ve (the potentials Va and Vb satisfy Va>Vb).

Description is made below on the operation of the potential generating circuit 14 having the aforementioned configuration. In the description below, all the p-channel transistors have the same threshold voltage value (|VTHa|) while all the n-channel transistors have the same threshold voltage value (VTHb). In addition, the resistance values of the resistors 371 and 372 are each R1 while the resistance values of the resistors 373 to 375 are each R2.

Since a gate electrode of the transistor 340 has the same level as the potential Vb, a drain electrode of the transistor 340 has a potential which is obtained by adding the potential Vb to the threshold voltage (Vb+|VTHa|).

In addition, since a source electrode of the transistor 343 has the same level as the potential Vb, drain and gate electrodes of the transistor 343 have a potential which is obtained by subtracting the threshold voltage (|VTHa|) from the potential Vb: (Vb−|VTHa|).

Further, since a gate electrode of the transistor 344 has a potential of (Vb−|VTHa|), a source electrode of the transistor 344 has a potential Vb which is obtained by subtracting the threshold voltage (|VTHa|) from the potential of the gate electrode (Vb−|VTHa|). One node of the resistor 372 receives the potential Va while the other node thereof receives the potential Vb, and thus the resistor 372 has a current value obtained by subtracting the potential Vb from the potential Va and then dividing it by the resistance value R1: ((Va−Vb)/R1).

Since a drain electrode of the transistor 350 has the same level as the potential Vc, drain and gate electrodes of the transistor 350 have a potential of (Vc−|VTHa|). In addition, since a drain electrode of the transistor 351 has the same level as the potential Vd, drain and gate electrodes of the transistor 351 have a potential of (Vd−|VTHa|). Further, since a drain electrode of the transistor 352 has the same level as the potential Ve, drain and gate electrodes of the transistor 352 have a potential of (Ve−|VTHa|).

Then, a source electrode of the transistor 353 has a potential of Vc. A source electrode of the transistor 354 has a potential of Vd. A source electrode of the transistor 353 has a potential of Ve.

Then, a gate electrode of the transistor 360 has a potential of (Vc+I×R2), a gate electrode of the transistor 361 has a potential of (Vd+I×R2), a gate electrode of the transistor 362 has a potential of (Ve+I×R2) (I denotes the respective current values of the transistors 357 to 359). The potentials supplied to these transistors 360 to 362 become the output of the potential generating circuit 14.

In this manner, the potential generating circuit 14 can generate new potentials (Vc+I×R2), (Vd+I×R2) and (Ve+I×R2) which are different from the potentials Va to Ve. In addition, since potentials generated by the potential generating circuit 14 have no relation to the threshold voltage value of transistors, it is not affected by variations in the threshold voltage of the transistors.

Thus, a source electrode of the transistor 360 has a potential of (Vc+I×R2−|VTHa|), a source electrode of the transistor 361 has a potential of (Vd+I×R2−|VTHa|), and a source electrode of the transistor 362 has a potential of (Ve+I×R2−|VTHa|). According to relational expressions of Vc>Vd and Vc>Ve, the transistor 363 is turned on while the transistor 364 is turned off when a signal inputted to the input node of the signal output circuit has an L level, and a potential of (Vc+I×R2−|VTHa|) is outputted from the output node of the signal output circuit.

Embodiment Mode 9

Figure 23A:
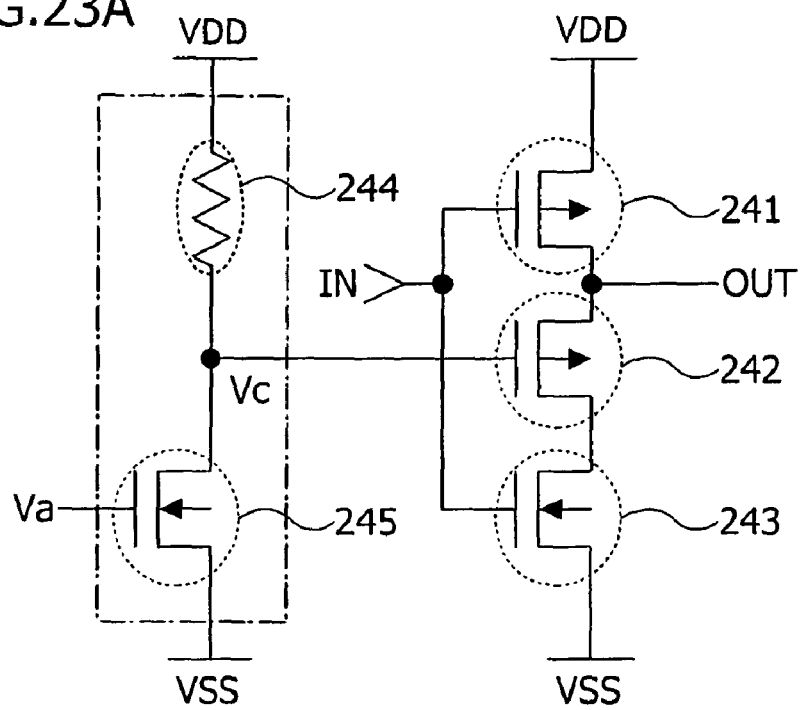
FIGS. 23A and 23B each illustrate a semiconductor device of the invention.
Figure 23B:
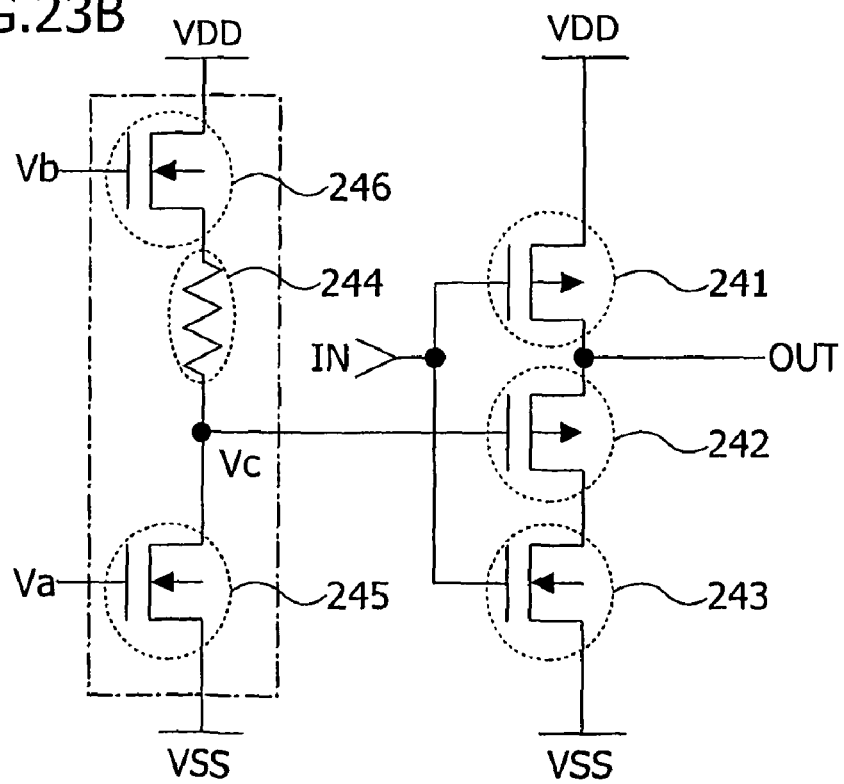

A semiconductor device of the invention includes the potential generating circuit 14 and transistors 241 to 243 (see FIGS. 23A and 23B). The potential generating circuit 14 has a resistor 244 and a transistor 245 (see FIG. 23A). In addition, the potential generating circuit 14 having a different configuration from the aforementioned includes a resistor 244 and transistors 245 and 246 (see FIG. 23B).

The transistors 241, 242 and 246 are n-channel transistors while the transistors 243 and 245 are p-channel transistors. A predetermined voltage (Va) is applied to a gate of the transistor 245, and the transistor 245 operates in the saturation region. Additionally, the transistor 245 operates as a constant current source. The potential generating circuit 14 generates a potential Vc which is different from the potentials of the high potential power source (VDD) and the low potential power source (VSS) (VSS<Vc<VDD).

If an H-level signal is inputted to an input node, the transistor 241 is turned off while the transistor 243 is turned on. Then, an output node outputs a potential (Vc+|VTHa|) which is obtained by adding the output potential Vc of the potential generating circuit 14 to the threshold voltage (|VTHa|) of the transistor 242.

Meanwhile, if an L-level signal is inputted to the input node, the transistor 241 is turned on while the transistor 243 is turned off, and a potential of the high potential power source (VDD) is outputted from the output node.

In this manner, in the semiconductor device of the invention, a potential difference between two signals outputted from an output node can be controlled to be smaller than a potential difference between the high potential power source and the low potential power source. Accordingly, the power consumption can be reduced.

Embodiment 1

Figure 14:
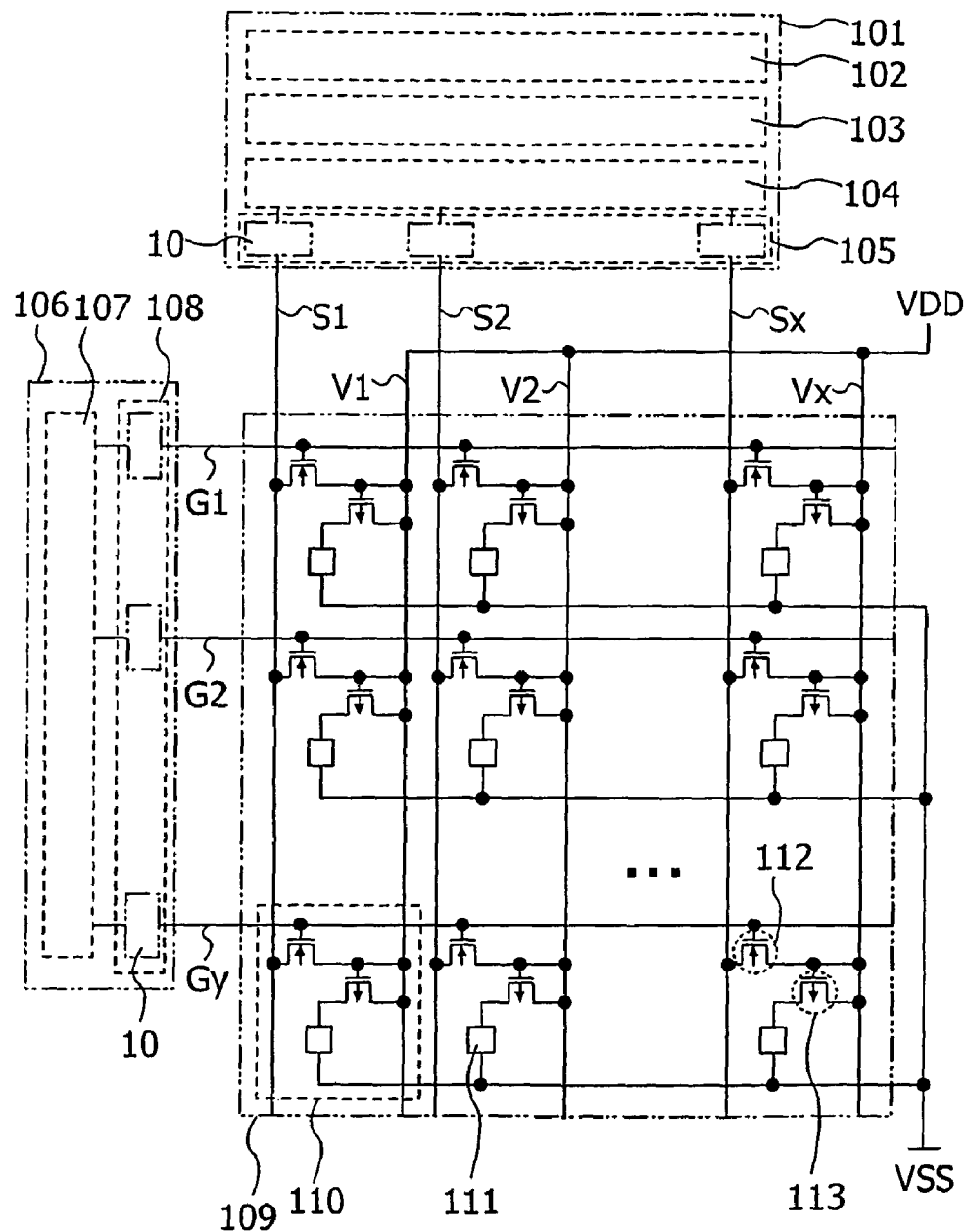
FIG. 14 illustrates a semiconductor device of the invention.

Description is made with reference to FIG. 14 on a configuration of a semiconductor device of the invention. The semiconductor device of the invention includes the source driver 101, the gate driver 106 and the pixel portion 109.

The source driver 101 includes a pulse output circuit 102, latch circuits 103 and 104, and a buffer circuit 105. The gate driver 106 includes a pulse output circuit 107 and a buffer circuit 108. The pulse output circuits 102 and 107 are circuits for outputting sampling pulses, such as shift registers or decoders. The latch circuits 103 and 104 hold video signals and outputs the video signals to a circuit of a lower stage. The buffer circuits 105 and 108 each include the multiple signal output circuits 10.

The pixel portion 109 has multiple (x, where x is a natural number) source lines (S1 to Sx), multiple (y, where y is a natural number) gate lines (G1 to Gy), multiple power source lines (V1 to Vx), and multiple pixels 110.

Each of the multiple pixels 110 has an n-channel transistor 112, a p-channel transistor 113 and a light-emitting element 111. The n-channel transistor 112 is a switching transistor for controlling input of video signals to the pixel 110. The p-channel transistor 113 is a driving transistor for controlling current supply to the light-emitting element 111 in accordance with a potential of the video signal inputted to the pixel 110. One electrode of the light-emitting element 111 is connected to the high potential power source (VDD) through the p-channel transistor 113 while the other electrode thereof is connected to the low potential power source (VSS). Therefore, the amount of current supplied to the light-emitting element 111 is determined by a potential difference between the high potential power source and the low potential power source.

Note that the configuration of the pixel 110 is not limited to the aforementioned, and a capacitor may be provided for holding a gate-source voltage of the p-channel transistor 113. Further, each of the switching transistor and the driving transistor is not limited to the aforementioned conductivity type, and either an n-channel or p-channel transistor may be employed.

In the case of expressing gray scales by using a semiconductor device, there is a method of using analog video signals or a method of using digital video signals. In the former method, gray scales are expressed by controlling the luminance of light-emitting elements with analog video signals. As the latter method, there is a time gray scale method or an area gray scale method. The invention may adopt either of the methods.

In the invention, the p-channel transistor 113 is operated in the linear region and constant voltage drive is performed in which a constant voltage is applied to the light-emitting element 111. In comparison with constant current drive, the constant voltage drive does not require the p-channel transistor 113 to operate in the saturation region; therefore, a driving voltage is not required to be increased. Accordingly, the power consumption can be reduced as compared to the constant current drive.

In the aforementioned configuration, the signal output circuits 10 are provided in the source driver 101, and two signals inputted to the p-channel transistor 113 have a potential difference which can certainly turn on or off the p-channel transistor 113 which is operated in the linear region. In addition, this potential difference is smaller than a potential difference between the high potential power source and the low potential power source. In this manner, in the invention, a potential difference between two signals inputted to the p-channel transistor 113 can be controlled to be smaller than a potential difference between the high potential power source and the low potential power source. Accordingly, the power consumption can be reduced. This embodiment can be appropriately implemented in combination with the aforementioned embodiment modes.

Embodiment 2

Figure 15:
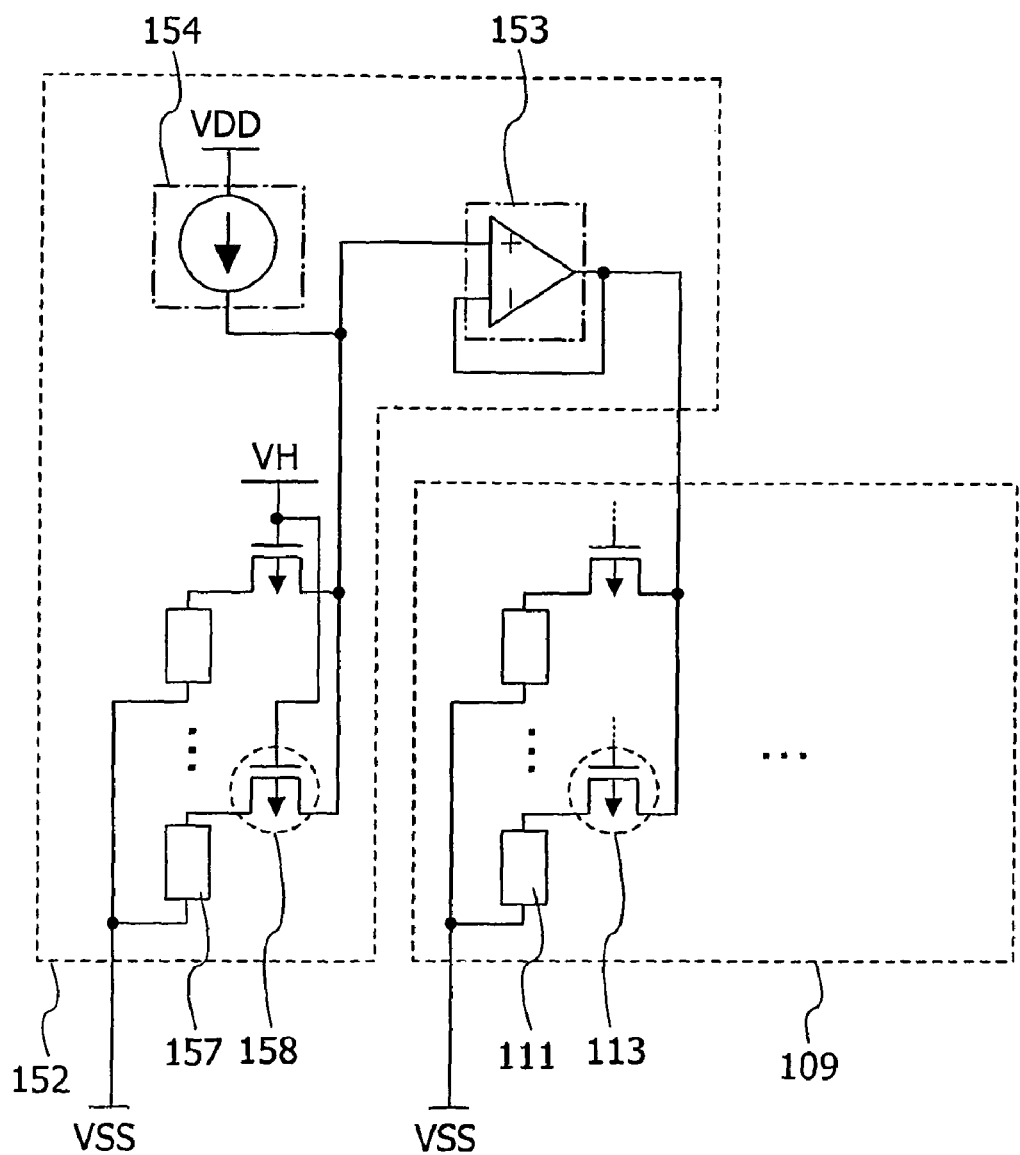
FIG. 15 illustrates a semiconductor device of the invention.

Description is made with reference to FIG. 15 on a configuration of a semiconductor device of the invention. The semiconductor device of the invention includes the pixel portion 109 and a monitoring unit 152. The pixel portion 109 has multiple pixels each of which includes the light-emitting element 111 and at least two transistors. In the shown configuration, only the p-channel transistor 113 connected in series to the light-emitting element 111 is shown. One of the two electrodes of the light-emitting element 111 is connected to the low potential power source (VSS) and the other is connected to the p-channel transistor 113.

The light-emitting element 111 has temperature dependency, and the resistance value thereof is decreased when the ambient temperature becomes high whereas the resistance value is increased when the ambient temperature becomes low. In addition, the light-emitting element degrades with time, and the resistance value thereof is increased in accordance with the degradation with time. The luminance of a light-emitting element depends on the current value supplied thereto. Therefore, if the ambient temperature changes or the light-emitting element degrades with time, the current value supplied to the light-emitting element changes, thereby the desired luminance cannot be obtained. The semiconductor device of this embodiment is characterized by having the monitoring unit 152. The monitoring element 152 has one or more monitoring light-emitting elements 157, a limiter transistor 158, a buffer amplifier 153 and a constant current source 154. One of two electrodes of the monitoring light-emitting element 157 is connected to the low potential power source (VSS) and the other is connected to the limiter transistor 158. A gate electrode of the limiter transistor 158 is kept at a constant potential (VH) and thus the limiter transistor 158 is on.

The light-emitting element 111 and the monitoring light-emitting element 157 are formed through the same steps with the same conditions, and have the same or substantially the same characteristics with respect to changes in the ambient temperature and degradation with time. The light-emitting element 111 and the monitoring light-emitting element 157 are provided over the same substrate. The monitoring light-emitting element 157 is supplied with a constant current from the constant current source 154. If the ambient temperature changes or the monitoring light-emitting element 157 degrades with time in such a state, the resistance value of the monitoring light-emitting element 157 changes. Since the current value of the monitoring light-emitting element 157 is constant at all times, when the resistance value of the monitoring light-emitting element 157 changes, a potential difference between the opposite electrodes of the monitoring light-emitting element 157 changes.

In the aforementioned configuration, a potential of one electrode of the monitoring light-emitting element 157 which is connected to the low potential power source does not change while a potential of the other electrode which is connected to the constant current source 154 changes. The changed potential of the electrode of the monitoring light-emitting element 157 is supplied to the input node of the buffer amplifier 153. Then, a potential outputted from the output node of the buffer amplifier 153 is supplied to one of two electrodes of the light-emitting element 111 through the p-channel transistor 113.

In this manner, a potential supplied to the light-emitting element 111 can be changed in accordance with changes in the ambient temperature and degradation with time of the light-emitting element 111; therefore, an adverse effect of changes in the ambient temperature and degradation with time of the light-emitting element 111 can be suppressed.

Note that in a semiconductor device having the aforementioned monitoring unit 152, a potential supplied to the light-emitting element 111 is gradually increased in accordance with a degradation with time in some cases. In such a case, a potential of the high potential power source may be set higher than the normal case in advance. In this manner, if a potential of the high potential power source is set high in advance, a potential difference between the high potential power source and the low potential power source is increased correspondingly. If there is a large potential difference between the high potential power source and the low potential power source, power consumption required for charging/discharging source lines or gate lines is increased correspondingly.

However, by providing the signal output circuit of the invention in a source driver or a gate driver, a potential difference between two signals outputted from the output node can be controlled to be smaller than a potential difference between the high potential power source and the low potential power source. Accordingly, power consumption required for charging/discharging source lines or gate lines can be reduced. That is, the signal output circuit of the invention can be effectively applied to a semiconductor device having the monitoring unit 152 as described above.

This embodiment can be appropriately implemented in combination with the aforementioned embodiment modes and embodiments.

Embodiment 3

Description is made with reference to FIGS. 16A to 17B on structures of the semiconductor device of the invention. The semiconductor device of the invention includes the pixel portion 109, the gate driver 106 and the source driver 101 (see FIG. 16A). The pixel portion 109 having multiple pixels each of which includes the light-emitting element 111 and the p-channel transistor 113, the gate driver 106, the source driver 101 and a connecting film 122 are provided over a substrate 120. The connecting film 122 is connected to multiple ICs.

Next, cross-sectional structures of a semiconductor device are described. The p-channel transistor 113, the light-emitting element 111 and the capacitor 124 included in the pixel portion 109, and multiple elements 125 included in the source driver 101 are formed over the substrate 120 (see FIGS. 16B, 17A and 17B).

A sealant 123 is provided around the pixel portion 109, the gate driver 106 and the source driver 101, and the light-emitting element 111 is sealed between the substrate 120 and a counter substrate 121 with the sealant 123. This sealing process is performed in order to protect the light-emitting element 111 from moisture, and a covering material (e.g., glass, ceramic, plastic or metals) is used for sealing here; however, alternatively, a sealing method using a heat curable resin or an ultraviolet curable resin, or a sealing method using a thin film with a high barrier property such as metal oxide or nitride may be employed.

Figure 16A:
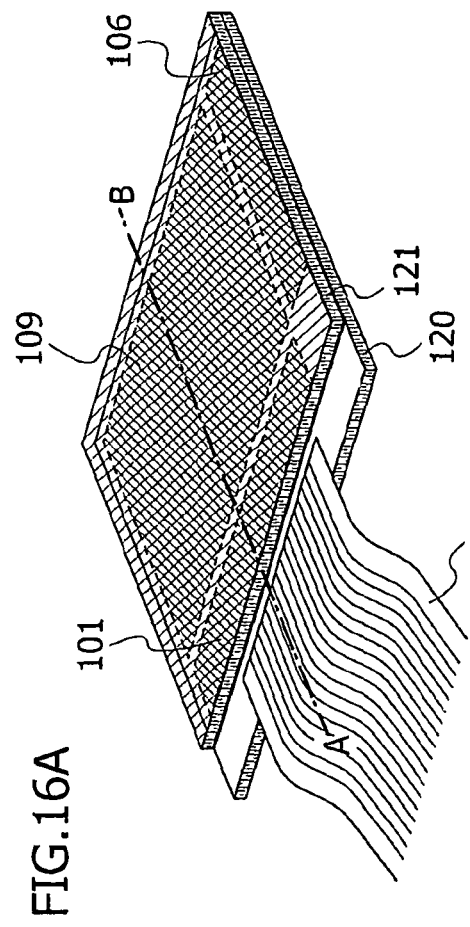
FIGS. 16A and 16B each illustrate a semiconductor device of the invention.
Figure 16B:
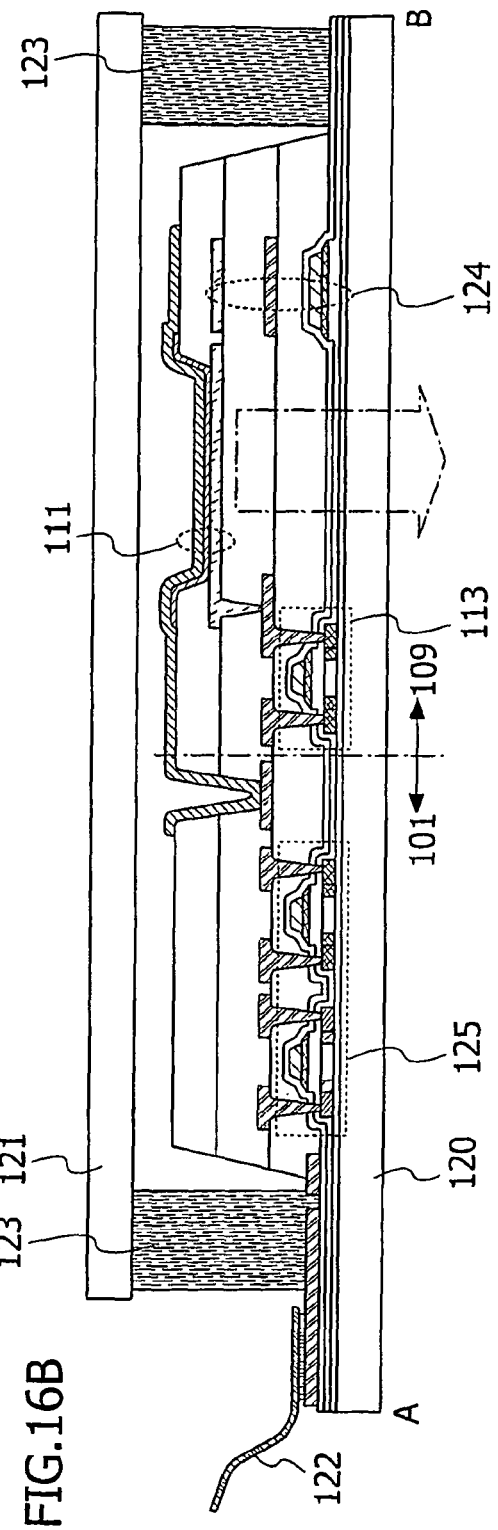

If a pixel electrode of the light-emitting element 111 transmits light whereas a counter electrode thereof shields light, the light-emitting element 111 performs bottom emission (see FIG. 16B). If the pixel electrode of the light-emitting element 111 shields light whereas the counter electrode thereof transmits light, the light-emitting element 111 performs top emission (see FIG. 17A). If both the pixel electrode and the counter electrode of the light-emitting element 111 transmit light, the light-emitting element 111 performs dual emission (see FIG. 17B).

An insulating layer may be provided over source/drain wires of the p-channel transistor 113. In such a case, the pixel electrode of the light-emitting element 111 may be provided over the insulating layer (see FIG. 16B), or in the same layer as the source/drain wires of the p-channel transistor 113 (see FIGS. 17A and 17B). In a portion where the source/drain wires of the p-channel transistor 113 and the pixel electrode of the light-emitting element 111 are stacked, the source/drain wires of the p-channel transistor 113 may be provided as the lower layer while the pixel electrode of the light-emitting element 111 may be provided as the upper layer (see FIG. 17A). Alternatively, the pixel electrode of the light-emitting element 111 may be provided as the lower layer while the source/drain wirings of the p-channel transistor 113 may be provided as the upper layer (see FIG. 17B).

Each element provided over the substrate 120 is preferably formed using a transistor which has a crystalline semiconductor with excellent characteristics such as mobility as a channel portion. Accordingly, monolithic integration over the same surface can be achieved. A semiconductor device having the aforementioned configuration has a less number of external ICs to be connected; therefore, downsizing, weight saving and thinner shape can be achieved.

Alternatively, each element provided over the substrate 120 may be formed using a transistor which has an amorphous semiconductor as a channel portion while the gate driver 106 and the source driver 101 may be constructed of IC chips. The IC chips are attached to the substrate 120 by COG bonding or attached to the connecting film 122. The amorphous semiconductor can be easily formed over a large substrate by using CVD without requiring a crystallization step; therefore, an inexpensive panel can be provided. In addition, by forming a conductive layer by a droplet discharge method typified by an ink-jet deposition method at this time, an even more inexpensive panel can be provided.

A light-emitting element included in the semiconductor device of the invention includes an element of which luminance is controlled with current or voltage, specifically such as an OLED (Organic Light Emitting Diode) or an MIM electron source element (electron-emitting element) used in an FED (Field Emission Display). An OLED as one of the light-emitting elements includes an anode, a cathode, and a layer containing an electroluminescent material (hereinafter abbreviated as an electroluminescent layer) which emits luminescence (electroluminescence) when an electric field is applied thereto. The electroluminescent layer is provided between the anode and the cathode, and has a single layer or multiple layers. Such layers may include an inorganic compound. The luminescence in the electroluminescent layer includes light emission (fluorescence) which is obtained in returning from a singlet excited state to the ground state, and light emission (phosphorescence) which is obtained in returning from a triplet excited state to the ground state. This embodiment can be appropriately implemented in combination with the aforementioned embodiment modes and embodiments.

Embodiment 4

Figure 18:
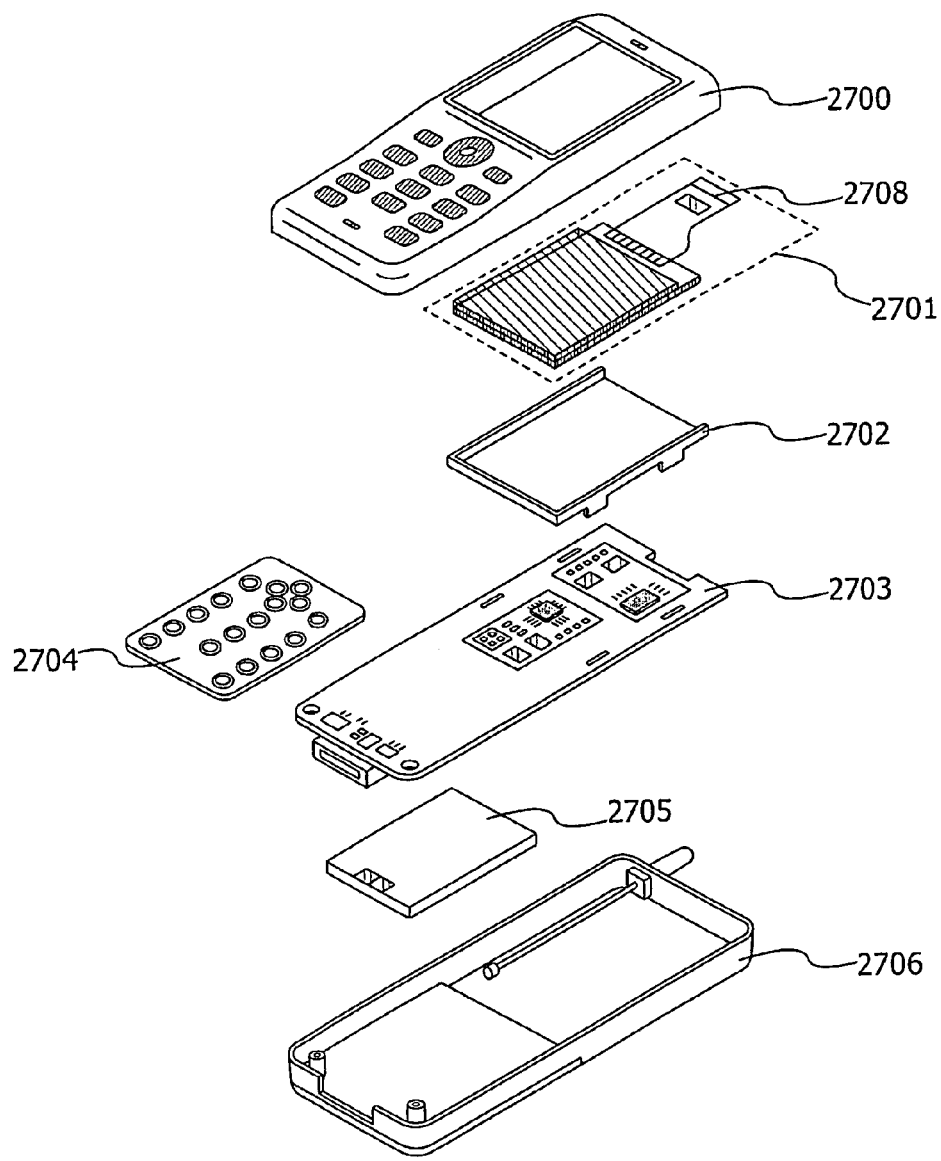
FIG. 18 illustrates an electronic appliance of the invention.
Figure 19A:
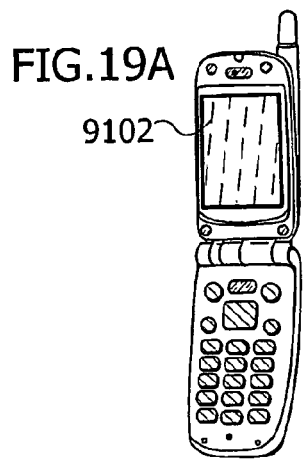
FIGS. 19A and 19F illustrate electronic appliances.
Figure 19B:
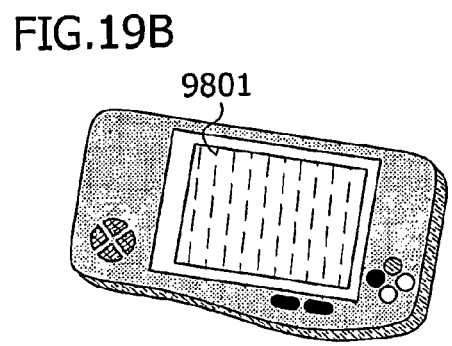
Figure 19C:
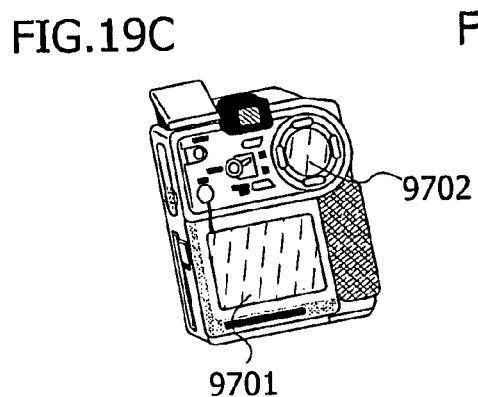
Figure 19D:
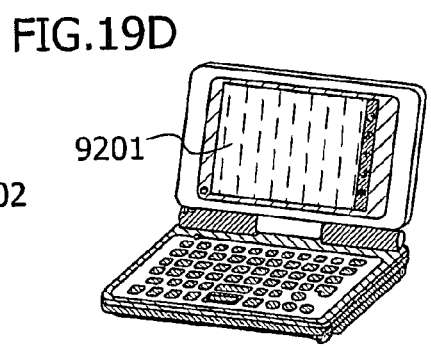
Figure 19E:
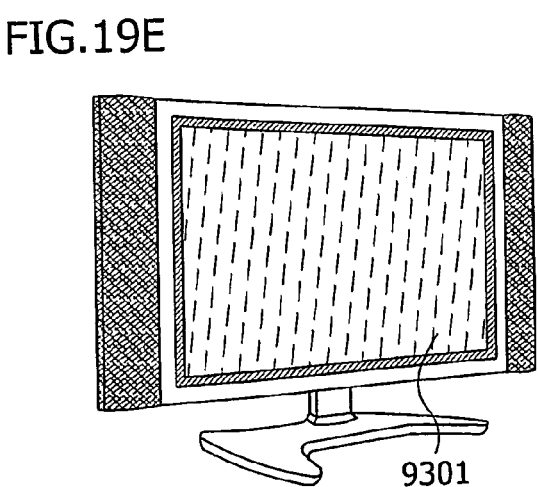
Figure 19F:
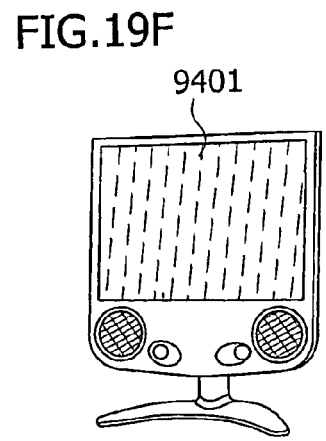
Figure 20A:
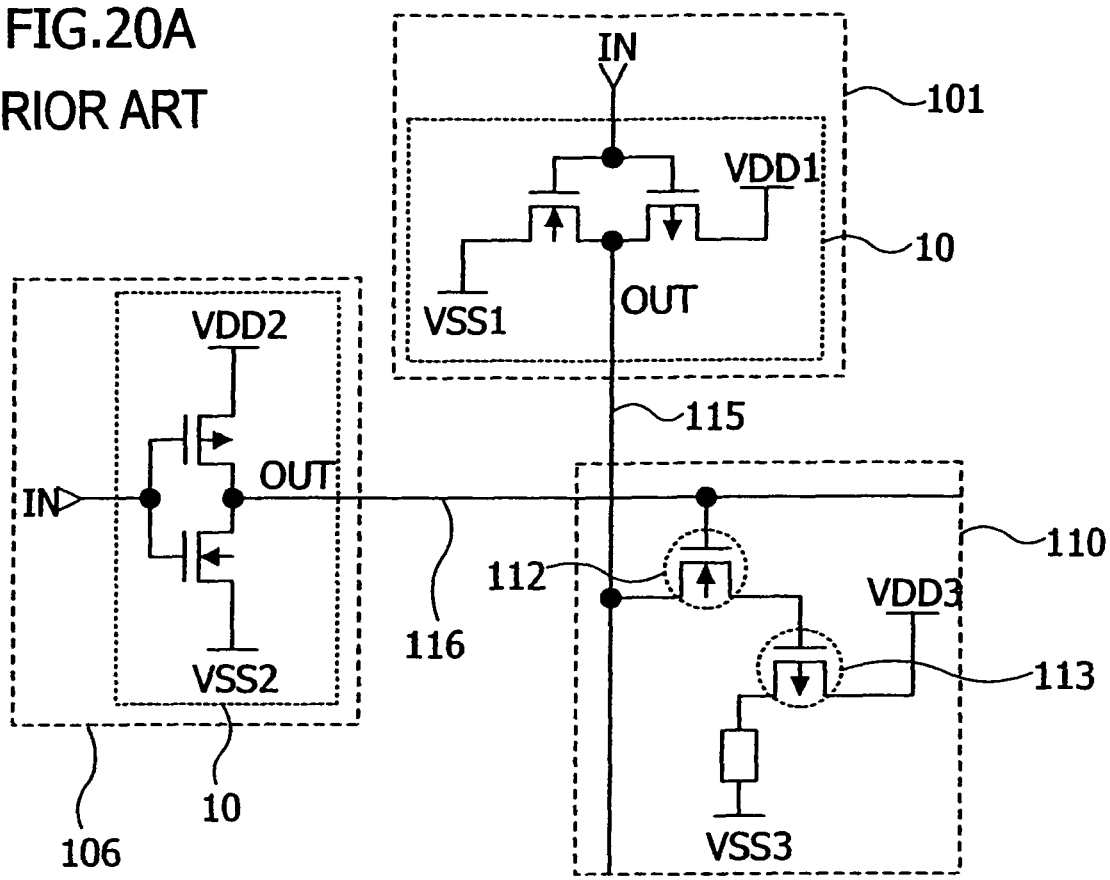
FIGS. 20A and 20B each illustrate a semiconductor device.
Figure 20B:
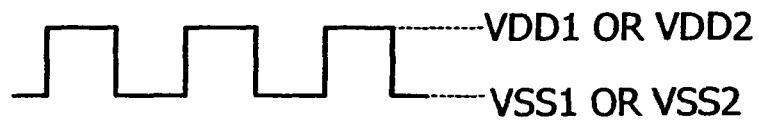

Description is made with reference to FIGS. 18 to 19F on modes of an electronic appliance using the semiconductor device of the invention. An electronic appliance illustrated here is a portable phone set, which includes housings 2700 and 2706, a panel 2701, a housing 2702, a printed wiring board 2703, operating buttons 2704 and a battery 2705 (see FIG. 18). The panel 2701 has a pixel portion in which multiple pixels are arranged in matrix, and the pixel portion is sealed with a pair of substrates. The panel 2701 is incorporated in the housing 2702 to be attached/detached easily, and the housing 2702 is put into the printed wiring board 2703. The shape and size of the housing 2702 are appropriately changed in accordance with an electronic appliance in which the panel 2701 is incorporated. Multiple IC chips which correspond to one or more of a central processing unit (CPU), a controller circuit, a power source circuit, a buffer amplifier, a source driver and a gate driver are mounted on the printed wiring board 2703. A module corresponds to a state in which the printed wiring board 2703 is mounted on the panel.

The panel 2701 is connected to the printed wiring board 2703 through the connecting film 2708. The panel 2701, the housing 2702 and the printed wiring board 2703 are incorporated into the housings 2700 and 2706 together with the operating button 2704 and the battery 2705. The pixel portion included in the panel 2701 is disposed so as to be seen from an open window provided in the housing 2700.

Note that the housings 2700 and 2706 are shown only as an illustrative external shape of the portable phone set, and an electronic appliance in accordance with this embodiment mode can be changed into various modes in accordance with the functions or applications. Thus, description is made with reference to FIGS. 19A to 19F on exemplary modes of electronic appliances.

A portable phone set as a portable terminal includes a pixel portion 9102 and the like (see FIG. 19A). A portable game machine as a portable terminal includes a pixel portion 9801 and the like (see FIG. 19B). A digital video camera includes pixel portions 9701 and 9702 and the like (see FIG. 19C). A PDA (Personal Digital Assistant) as a portable information terminal includes a pixel portion 9201 and the like (see FIG. 19D). A television set includes a pixel portion 9301 and the like (see FIG. 19E). A monitor device includes a pixel portion 9401 and the like (see FIG. 19F).

The invention can be applied to various electronic appliances such as a portable terminal typified by a portable phone set (also called a portable phone device or a portable phone), a PDA, an electronic data book and a portable game machine, a television set (also called a television or a television receiver), a display (also called a monitor device), a camera (e.g., a digital camera or a digital video camera), an audio reproducing device (e.g., a car audio component set), and a home-use game machine.

This embodiment can be appropriately implemented in combination with the aforementioned embodiment modes and embodiments.

The invention claimed is:

1. A semiconductor device comprising:
   a first transistor;
   a second transistor;
   a first inverter and a second inverter;
   a first power source applying a first potential;
   a second power source applying a second potential;
   a first circuit;
   a second circuit; and
   a first pixel including a first display element and a second pixel including a second display element,
   wherein each of the first and second inverters comprising:
   a third transistor; and
   a fourth transistor,
   wherein one of a source and a drain of the second transistor is electrically connected to the second power source,
   wherein the other of the source and the drain of the second transistor is electrically connected to each of the first and second inverters,
   wherein one of a source and a drain of the first transistor is electrically connected to the first power source,
   wherein the other of the source and the drain of the first transistor is electrically connected to each of the first and second inverters,
   wherein the first transistor is electrically connected to the second transistor through at least one of the first and second inverters,
   wherein a gate of the first transistor is electrically connected to the second circuit,
   wherein a gate of the second transistor is electrically connected to the first circuit,
   wherein the first inverter is electrically connected to the first pixel, and
   wherein the second inverter is electrically connected to the second pixel.

2. An electronic appliance using the semiconductor device according to claim 1.

3. The semiconductor device according to claim 1, wherein the first circuit is configured to generate a third potential which is different from the first potential and the second potential, and the second circuit is configured to generate a fourth potential which is different from the first potential and the second potential.

4. The semiconductor device according to claim 3,
   wherein the first circuit includes multiple resistors connected in series,
   wherein an end of the multiple resistors is electrically connected to the first power source,
   wherein an end of another one of the multiple resistors is electrically connected to the second power source, and
   wherein the third potential is outputted from a connecting node of two resistors that are selected from the multiple resistors.

5. The semiconductor device according to claim 3,
   wherein the second circuit includes multiple resistors connected in series,
   wherein an end of the multiple resistors is electrically connected to the first power source,
   wherein an end of another one of the multiple resistors is electrically connected to the second power source, and
   wherein the fourth potential is outputted from a connecting node of two resistors that are selected from the multiple resistors.

6. The semiconductor device according to claim 3,
   wherein the third potential is different from the fourth potential.

7. The semiconductor device according to claim 1,
   wherein the first display element is a light-emitting element and the second display element is a light-emitting element.

* * * * *